(12) United States Patent
Rodegheri et al.

(10) Patent No.: US 10,158,064 B2
(45) Date of Patent: Dec. 18, 2018

(54) DIAPHRAGM ACTUATOR AND METHOD FOR PRODUCING A DIAPHRAGM ACTUATOR

(71) Applicants: Buerkert Werke GmbH, Ingelfingen (DE); CUT Membrane Technology GmbH, Ingelfingen (DE)

(72) Inventors: Cricia de Carvalho Rodegheri, Mainz (DE); Jan Westermann, Karlsruhe (DE); Klaus-Guenther Beck, Kuenzelsau (DE); Peter Krippner, Karlsruhe (DE); Christoph Dittrich, Grevenbroich (DE)

(73) Assignee: Buerkert Werke GmbH, Ingelfingen (DE)

(*) Notice: Subject to any disclaimer, the term of this patent is extended or adjusted under 35 U.S.C. 154(b) by 378 days.

(21) Appl. No.: 14/927,235

(22) Filed: Oct. 29, 2015

(65) Prior Publication Data

US 2016/0126450 A1     May 5, 2016

(30) Foreign Application Priority Data

Nov. 5, 2014  (DE) .......... 10 2014 116 120

(51) Int. Cl.
| | |
|---|---|
| H01L 41/09 | (2006.01) |
| H01L 41/27 | (2013.01) |
| H01L 41/047 | (2006.01) |
| H01L 41/053 | (2006.01) |
| H01L 41/083 | (2006.01) |
| H01L 41/25 | (2013.01) |
| H01L 41/193 | (2006.01) |

(52) U.S. Cl.
CPC .......... *H01L 41/27* (2013.01); *H01L 41/0471* (2013.01); *H01L 41/0474* (2013.01); *H01L 41/053* (2013.01); *H01L 41/0833* (2013.01); *H01L 41/0835* (2013.01); *H01L 41/0986* (2013.01); *H01L 41/25* (2013.01); *H01L 41/193* (2013.01)

(58) Field of Classification Search
CPC ... H04R 17/00; H01L 41/0474; H01L 41/053; H01L 41/0833; H01L 41/0835
USPC ......................................................... 310/324
See application file for complete search history.

(56) References Cited

U.S. PATENT DOCUMENTS

| | | | |
|---|---|---|---|
| 7,049,732 B2 | 5/2006 | Pei et al. | |
| 8,797,654 B2 | 8/2014 | Blum | |

(Continued)

FOREIGN PATENT DOCUMENTS

| | | |
|---|---|---|
| CN | 101558246 A | 10/2009 |
| CN | 102099712 A | 6/2011 |

(Continued)

OTHER PUBLICATIONS

German Search Report dated Jun. 3, 2015 from corresponding DE Application No. 10 2014 116 120.3, along with partial unofficial English translation.

*Primary Examiner* — Bryan P Gordon
(74) *Attorney, Agent, or Firm* — Dilworth IP, LLC

(57) ABSTRACT

A diaphragm actuator has a first frame part and a second frame part, between which at least two diaphragm layers are disposed in a stacked manner and formed as electro-active polymer layers. Furthermore, a method for producing a diaphragm actuator is described.

16 Claims, 20 Drawing Sheets

(56) References Cited

U.S. PATENT DOCUMENTS

| | | | |
|---|---|---|---|
| 2007/0236107 A1* | 10/2007 | Maruyama | H01L 41/083 310/366 |
| 2008/0122315 A1* | 5/2008 | Maruyama | G06F 3/016 310/314 |
| 2008/0218032 A1* | 9/2008 | Okamoto | F02M 47/027 310/358 |
| 2009/0161239 A1 | 6/2009 | Verhaar et al. | |
| 2009/0236939 A1* | 9/2009 | Heim | F04B 43/0054 310/324 |
| 2011/0149410 A1* | 6/2011 | Blum | G02B 3/14 359/666 |
| 2012/0200200 A1* | 8/2012 | Jung | H01L 41/0478 310/365 |
| 2013/0207793 A1* | 8/2013 | Weaber | G06F 1/1601 340/407.2 |

FOREIGN PATENT DOCUMENTS

| | | |
|---|---|---|
| CN | 103200985 A | 7/2013 |
| WO | 2008083325 A1 | 7/2008 |

\* cited by examiner

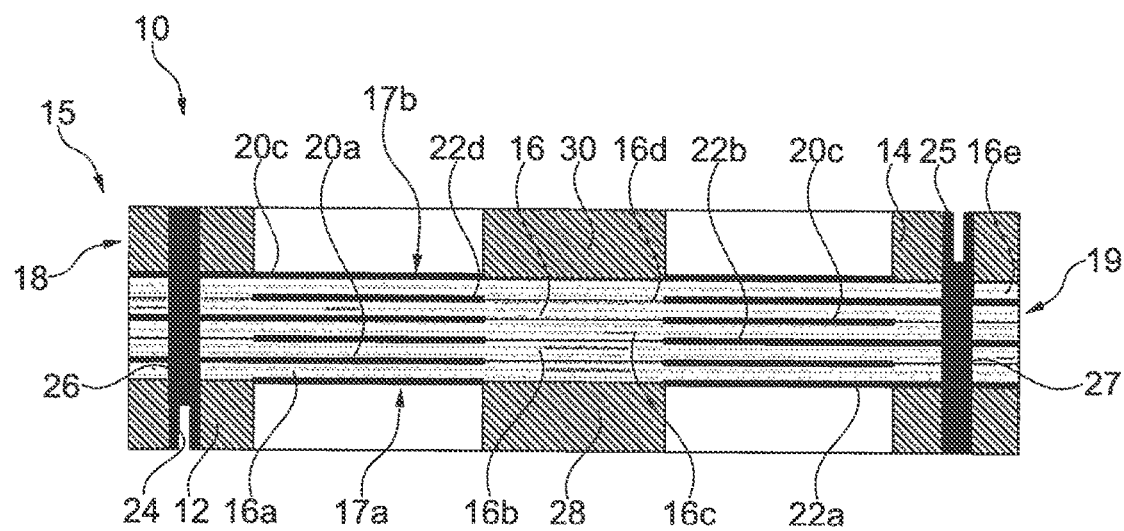
Fig. 1a
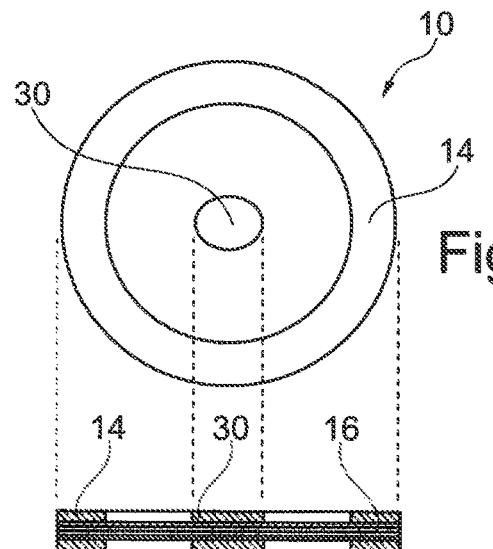
Fig. 2a
Fig. 2b
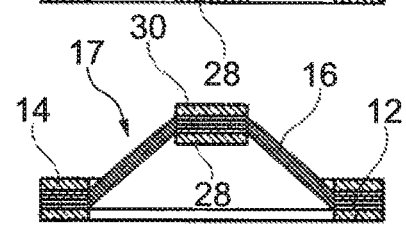
Fig. 2c

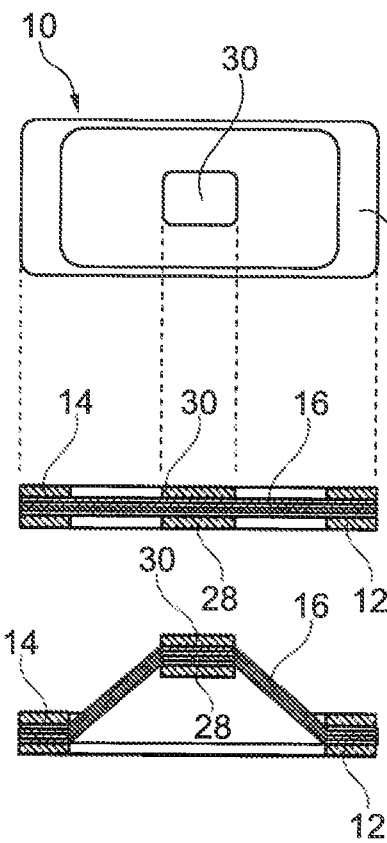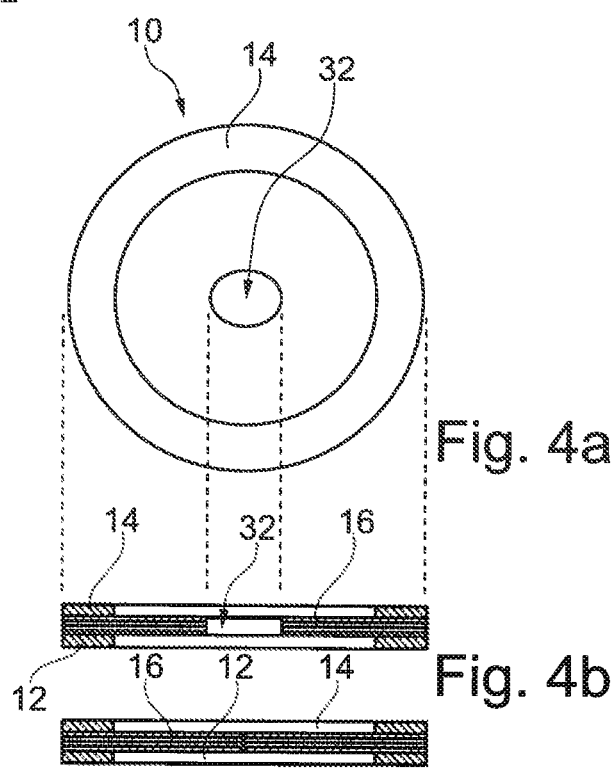
Fig. 3a
Fig. 3b
Fig. 3c
Fig. 4a
Fig. 4b
Fig. 4c

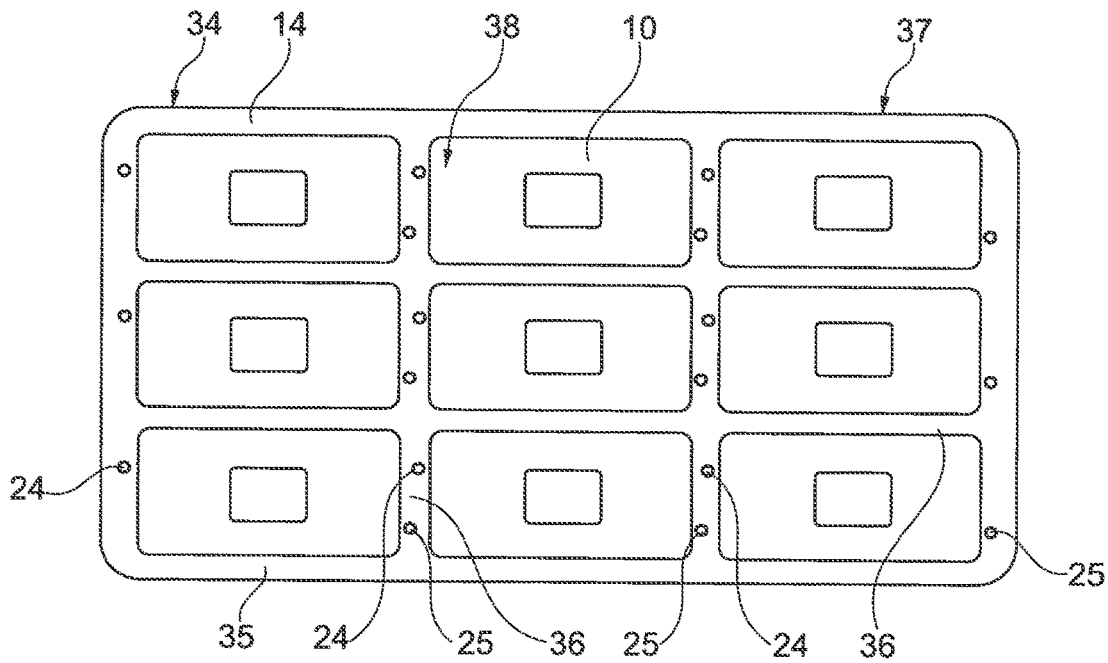
Fig. 7
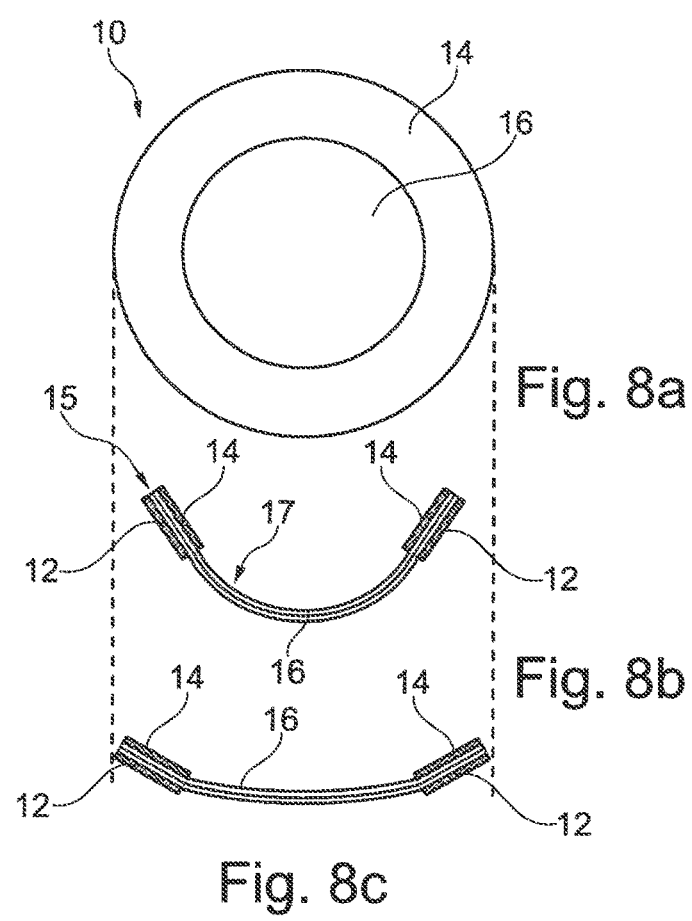
Fig. 8a
Fig. 8b
Fig. 8c

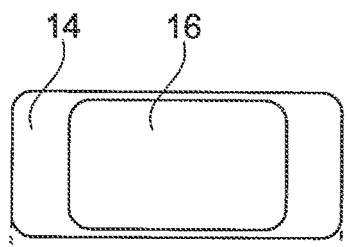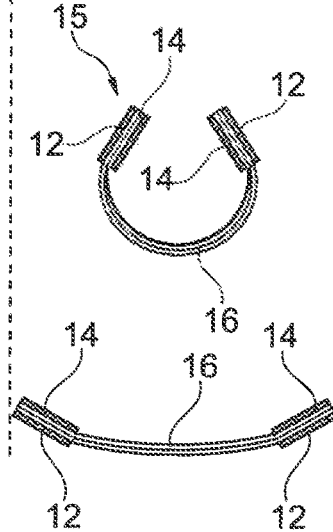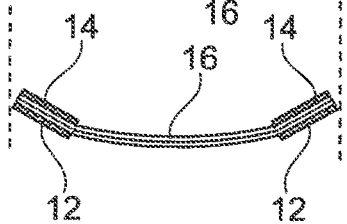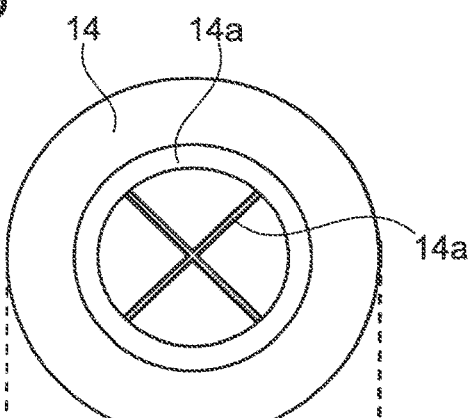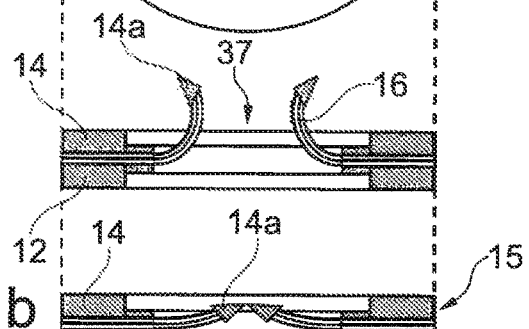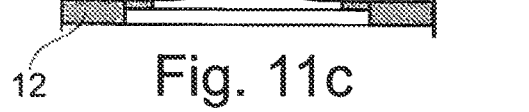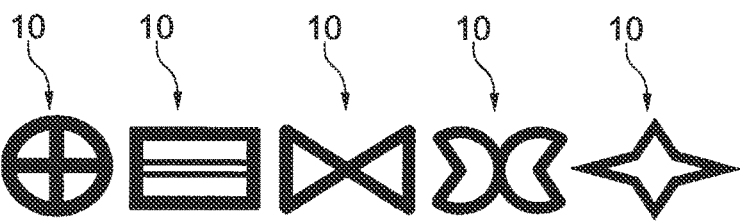

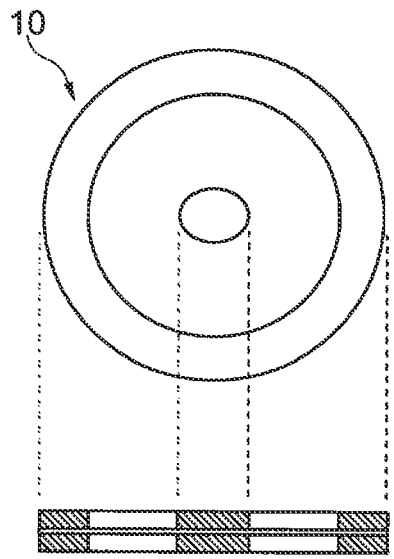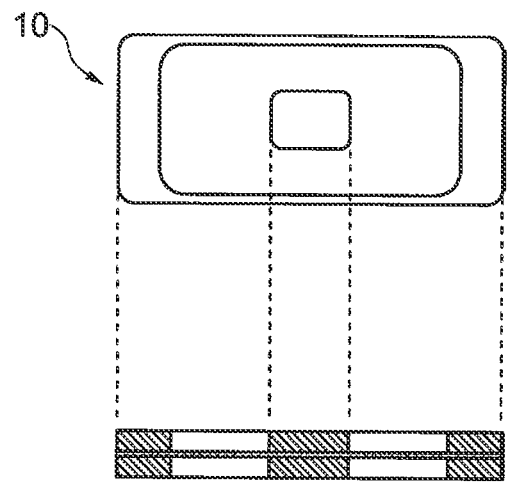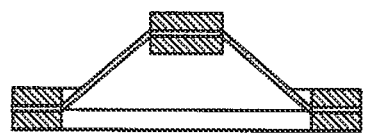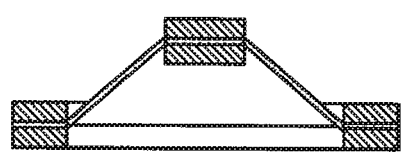
Fig. 22a     Fig. 22b
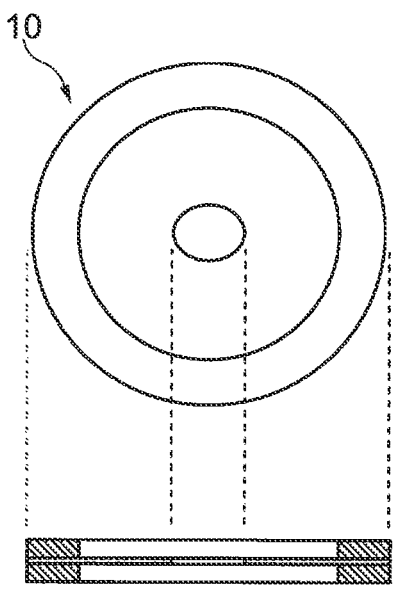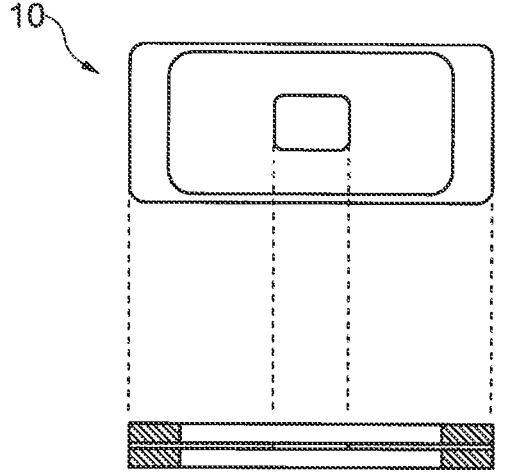
Fig. 22c     Fig. 22d

DIAPHRAGM ACTUATOR AND METHOD FOR PRODUCING A DIAPHRAGM ACTUATOR

The invention relates to a diaphragm actuator and a method for producing a diaphragm actuator.

BACKGROUND OF THE INVENTION

The term "actuator" as used herein designates a component or an assembly with which electrical energy is converted into mechanical energy, whereby a movement of a part of the actuator is generated which can be transferred to an element to be actuated. An actuator of this type can advantageously be used inter alia in fluid valve technology, e.g. in order to actuate a valve.

A diaphragm actuator is characterised in that it has a diaphragm layer which is used to convert the electrical energy into mechanical energy. For this purpose, the diaphragm layer can typically be formed from an electro-active polymer which e.g. expands or contracts when a voltage is applied. In this way the electrical energy applied by the application of voltage is converted into mechanical energy, which leads to a movement of an output part of the actuator.

Suitable electro-active polymers are e.g. silicone, polyurethane and acrylate.

It is known from the prior art to stack such diaphragm actuators on top of one another to form a stacked diaphragm actuator in order to increase the available force thereof. For example, a stacked diaphragm actuator of this type is known from WO 2008/083325 A, in which each diaphragm layer is clamped in between two frame parts. A plurality of these diaphragm actuators are stacked one above the other in order to form the stacked diaphragm actuator.

In stacked diaphragm actuators of this type it has proved to be disadvantageous that they require a lot of space since the individual diaphragm actuators each lie on top of one another via their frame parts. However, the frames are of greater height than the active regions of the diaphragm layers which generate the movement, i.e. the regions of the diaphragm layers which are disposed between electrode layers. Much space thereby is wasted.

It is the object of the invention to form a diaphragm actuator which can exert a high level of force but nevertheless requires little installation space.

BRIEF DESCRIPTION OF THE INVENTION

The object is achieved in accordance with the invention by a diaphragm actuator which has a first frame part and a second frame part, between which at least two diaphragm layers are disposed in a stacked manner and formed as electro-active polymer layers.

The fundamental idea of the invention is to reduce the space required for the diaphragm actuator in that not every individual diaphragm layer is clamped in its own frame. It is much rather the case that a plurality of diaphragm layers made from an electro-active polymer (EAP diaphragms) are clamped in between a single frame. Thus a diaphragm actuator of this type can also be termed a multi-layer diaphragm actuator since a plurality of diaphragm layers are disposed in an actuator, in particular in a frame of the actuator. Nevertheless the plurality of diaphragm layers can provide a high level of force, whereby a diaphragm actuator formed in this way can generate comparable forces to the stacked diaphragm actuators known from the prior art but is of lower construction height.

In particular the diaphragm actuator can be a dielectric elastomeric actuator.

A dielectric elastomeric actuator is generally based on an electrode with a large surface area being disposed on each of two mutually opposing sides of a dielectric polymer film. If a sufficiently strong electric voltage is applied to the electrodes, the electrodes are drawn towards one another and so the polymer film lying therebetween is compressed. Since the dielectric polymer film used is almost incompressible, the reduction in the spacing between the electrodes leads to a change in shape. In a diaphragm e.g. the middle portion of a circular diaphragm can be deflected in the axial direction with respect to the outer edge when an electric voltage is applied to the electrodes on both sides of the diaphragm; the reduction in the thickness of the dielectric polymer film is, to put it simply, converted into a greater axial length for the diaphragm.

One aspect of the invention makes provision for the at least two active diaphragm layers to lie directly against one another. In this way, the space requirement of the diaphragm actuator is considerably reduced since the individual diaphragm layers are very thin and no further component is disposed therebetween.

Furthermore, provision is made for the first frame part to be able to lie against a first surface of the at least two diaphragm layers and/or the second frame part to be able to lie against a second surface of the at least two diaphragm layers, which second surface is opposite to the first surface. The first frame part can constitute a lower termination of the diaphragm actuator, whereas the second frame part forms an upper termination of the diaphragm actuator. The diaphragm layers lying between the frame parts can thereby be held in a secure and fixed manner.

In accordance with a first embodiment of the diaphragm actuator in accordance with the invention, a first connecting part is provided which lies against the first surface of the at least two diaphragm layers and/or a second connecting part is provided which lies against the second surface of the at least two diaphragm layers, wherein in particular the first connecting part and/or the second connecting part lie(s) centrally on the respective surface. By means of the first or the second connecting part the diaphragm actuator can cooperate with the element to be actuated. This can happen e.g. in that the diaphragm actuator is connected to the respective part to be moved in each case via the first and/or the second connecting part. Alternatively, the connecting parts can also serve as stop elements which, upon movement of the actuator, engage on an element to be actuated. Furthermore, a respective element to be actuated can also be allocated to both connecting parts. By means of the central arrangement of the first and/or of the second connecting part it is ensured that the connecting parts undergo a homogeneous displacement movement upon activation of the diaphragm actuator.

In accordance with a second embodiment of the invention, provision is made that the at least two diaphragm layers each have an opening which is provided centrally in the respective diaphragm layer and in particular is circular. In a diaphragm actuator of this type provision can be made e.g. for the diaphragm layers to expand or contract mechanically upon application of a voltage, such that the opening within the diaphragm layers is changed. In this connection, the opening can contract e.g. when an electric voltage is applied, whereby the size of the opening is reduced. The opening can be circular or substantially rectangular.

Furthermore, provision can be made for the at least two diaphragm layers to be circular or substantially rectangular.

By means of the respective formation of the diaphragm layers, different mechanical movements of the diaphragm actuator can be achieved when it is electrically activated.

In particular the first frame part and/or the second frame part can be circular or substantially rectangular. The frame parts are formed to correspond to the respective diaphragm layers in order to ensure that the frame parts can fixedly hold the diaphragm layers at their outer edges in each case or are attached to the diaphragm layers via the respective edges. The region of the diaphragm layers which is not fixed by the frame parts serves as an active region which converts movement when the diaphragm actuator is energised.

A further aspect of the invention makes provision for the first frame part and/or the second frame part to be at least partially flexible. By reason of the partially flexible formation of the frame parts, a diaphragm actuator can be created which is able to adopt different shapes or can exert movements since the frame itself can deform by reason of the at least partially flexible frame parts. The diaphragm actuator can comprise a DEMES structure or be formed therefrom. A DEMES structure (Dielectric Elastomer Minimum Energy Structure) is a structure which adopts a condition which is favourable in terms of energy (state of equilibrium). By activation of the diaphragm layers, energy can therefore be introduced into the diaphragm actuator at least partially formed from a DEMES structure and so the actuator is deformed out of its state of equilibrium which is favourable in terms of energy. In particular, the diaphragm actuator can also be completely flexible, i.e. consist entirely of a DEMES structure.

Furthermore, the at least two diaphragm layers each comprise an electrode. By means of the electrodes it is ensured that the diaphragm layers can have electric voltage applied to them. The electro-active diaphragm layers can therefore expand or contract when an electric voltage is applied to them.

In particular, the electrodes of directly adjacent diaphragm layers are disposed offset with respect to one another. In this way it is possible to ensure in the case of a diaphragm actuator with diaphragm layers disposed in a stack that an electric field is formed between the directly adjacent diaphragm layers. For this purpose, the mutually offset diaphragm layers are allocated to different poles of a voltage source. Hence, a single voltage source can suffice to apply electricity to all the diaphragm layers.

A further aspect of the invention makes provision for the first frame part to have a first terminal and/or the second frame part to have a second terminal. By means of the terminals the diaphragm layers, in particular the electrodes thereof, have a voltage applied to them. The frame parts which serve to fix the individual diaphragm layers therefore simultaneously ensure the indirect electrical supply of the individual diaphragm layers and fixing of the diaphragm layers at the edge.

In particular, the electrodes of the at least two diaphragm layers are electrically contacted, wherein the electrodes of every second diaphragm layer are coupled to the first terminal and the other diaphragm layers are coupled to the second terminal. This results in asymmetrical contacting of the stacked diaphragm layers since between every two adjacent diaphragm layers an electric field is always formed, which is necessary in order to create a voltage in the respective diaphragm layers.

The object of the invention is further achieved by a method for producing a diaphragm actuator, comprising the following steps:

a) providing a first tool part, a first frame part and a polymer film made from an electro-active material.
b) disposing the first frame part on the first tool part,
c) clamping the polymer film,
d) mechanically expanding the polymer film,
e) fixing the polymer film, in particular on the first tool part, and
f) cutting the polymer film so that a diaphragm layer is produced.

By means of the method in accordance with the invention it is ensured that the required pretensioning of the diaphragm layer can be achieved. By reason of the pretensioning, the available force of the diaphragm actuator can be increased. By expansion or stretching of the diaphragm layer a preferred direction of the actuator is defined.

In accordance with one aspect of the invention a step g) is carried out in which at least one electrode is attached to the diaphragm layer, wherein in particular step g) is carried out after steps c) to e). The attachment of the electrode is important in order that a voltage can be applied to the diaphragm layer. The electrode should in particular be attached after the mechanical expansion in step d) in order to prevent damage to the electrode. The at least one electrode can be attached by means of a wet chemical process such as spraying, stamping, printing or screen printing. In general, an extremely wide variety of electrode patterns can thereby be achieved.

Furthermore, the steps c) to e) are carried out repeatedly in order to form a plurality of diaphragm layers. In dependence upon the repetitions a multi-layer diaphragm actuator is created which has diaphragm layers corresponding to the number of repetitions. The available force of the diaphragm actuator is thereby increased.

In particular, the electrodes of directly adjacent diaphragm layers are disposed offset with respect to one another at least in regions. In this way it is ensured that in each case directly adjacent diaphragm layers can be supplied with or coupled to a different voltage or a different terminal and so an electric field can be created between directly adjacent diaphragm layers when a voltage is applied to the diaphragm actuator.

Furthermore, a second frame part is provided which is disposed on the side of the at least one diaphragm layer opposite to the first frame part. Therefore, the second frame part forms the termination of the diaphragm actuator opposite to the first frame part, whereby it is ensured that the at least one diaphragm layer is disposed between the two frame parts. The at least one diaphragm layer is therefore clamped in securely.

Furthermore, provision is made for the polymer film to be expanded unidirectionally or radially, in particular is expanded uniformly, in step d). By means of the expansion a multi-layer diaphragm actuator with pre-expanded diaphragm layers can be provided which provides a large force with a compact structure. The radial expansion is of significance in particular in diaphragm layers which are circular. By means of the uniformly radial expansion it is ensured that a circular diaphragm layer which is clamped in a circular frame is compressed between the electrodes, e.g. when the electrodes are acted upon in the active region thereof, such that the wall thickness at that location is reduced. Since the material of the diaphragm layers is incompressible, it "elongates" and so the centre of the diaphragm can be deflected with respect to the initial condition. If the voltage is withdrawn from the electrodes, the actuator returns to the initial condition; the wall thickness of the diaphragm layers increases, whereby the centre is retracted into its original position. In general, the pre-expansion means that a defined movement of the diaphragm actuator can be achieved with a larger force.

In particular, the first tool part is moved in step d) in order to expand the polymer film mechanically. The first tool part therefore serves not only to fix the polymer film in order to form the diaphragm layer but also in order to expand the polymer film. In this way, a simple method is provided for producing the diaphragm actuator, in particular a diaphragm actuator with pre-expanded diaphragm layers.

Furthermore, a second tool part can be provided which is likewise moved in order to expand the polymer film. This second tool part can in particular be provided when a radial expansion of the polymer film or of the diaphragm layer is to take place.

In accordance with one aspect of the invention, the second tool part has a structure which substantially corresponds to the first frame part and/or the second tool part is positioned opposite to the first frame part. By reason of the positioning and/or design of the second tool part, the radial expansion of the polymer film can take place. For this purpose, the second tool part is in particular able to move such that it can travel in the direction of the first tool part on which the first frame part is disposed. The correspondingly formed structure ensures that the radial expansion of the polymer film takes place in order to form the radially pre-expanded diaphragm layer.

In accordance with a further aspect of the invention, the first diaphragm layer is attached to the first frame part, in particular is adhered or welded thereto. This ensures that a firm connection between the frame part and the edge of the first diaphragm layer is provided and so a relative movement between the first frame part and the first diaphragm layer cannot take place.

Furthermore, the further diaphragm layers can also be connected to the first frame part or the previous diaphragm layer. The connection is effected at the edge.

In particular, the first tool part has a working table or a working drum which has a plurality of working surfaces. In this way an extremely economical production method can be achieved which can be carried out in an very small space.

In particular, the first tool part formed as a working drum rotates about an axis of rotation and so a polymer film portion of the polymer film allocated to a working surface is supplied to different working stations. In this way a multi-layer diaphragm actuator can be produced in an extremely efficient manner since the respective diaphragm layer to be processed passes through a plurality of stations in succession. By reason of the expansion of the working drum about its axis of rotation, the space requirement is also slight. At the same time, further multi-layer diaphragm actuators can be subjected to other method steps on the other working surfaces.

In general, the working surfaces can be formed in such a way that a plurality of diaphragm actuators can be formed simultaneously. A batch of diaphragm actuators is accordingly produced on one working surface. For this purpose, a matrix can be disposed on the corresponding working surface.

BRIEF DESCRIPTION OF THE DRAWINGS

Further advantages and properties of the invention will be apparent from the following description and the drawings to which reference is made. In the drawings:

FIGS. 2a to 2c show an illustration of the diaphragm actuator of FIG. 1a in accordance with the invention, in a plan view, a cross-sectional view in the initial condition and a cross-sectional view in the activated condition, FIGS. 3a to 3c show an illustration of a second embodiment of the diaphragm actuator in accordance with the invention in a plan view, a cross-sectional view in the initial condition and a cross-sectional view in the activated condition, FIGS. 4a to 4c show an illustration of a third embodiment of a diaphragm actuator in accordance with the invention, in a plan view, a cross-sectional view in the initial condition and a cross-sectional view in the activated condition, FIG. 7 shows a plan view of a matrix diaphragm actuator in accordance with the invention, FIGS. 8a to 8c show an illustration of a ninth embodiment of a diaphragm actuator in accordance with the invention, in a plan view in the activated condition, a cross-sectional view in the initial condition and a cross-sectional view in the activated condition, FIGS. 9a to 9c show an illustration of a tenth embodiment of a diaphragm actuator in accordance with the invention, in a plan view in the activated condition, a cross-sectional view in the initial condition and a cross-sectional view in the activated condition, FIG. 10a shows a plan view of an eleventh embodiment of a diaphragm actuator in accordance with the invention, FIG. 10b shows a plan view of a twelfth embodiment of a diaphragm actuator in accordance with the invention, FIG. 10c shows a plan view of a thirteenth embodiment of a diaphragm actuator in accordance with the invention, FIG. 10d shows a plan view of a fourteenth embodiment of a diaphragm actuator in accordance with the invention, FIG. 10e shows a plan view of a fifteenth embodiment of a diaphragm actuator in accordance with the invention, FIGS. 11a to 11c show an illustration of a sixteenth embodiment of a diaphragm actuator in accordance with the invention, in a plan view, a cross-sectional view in the initial condition and a cross-sectional view in the activated condition.

FIG. 22a shows an overview of a further diaphragm actuator produced by the production method in accordance with the invention, FIG. 22b shows an overview of a further diaphragm actuator produced by the production method in accordance with the invention, FIG. 22c shows an overview of a further diaphragm actuator produced by the production method in accordance with the invention, FIG. 22d shows an overview of a further diaphragm actuator produced by the production method in accordance with the invention.

DETAILED DESCRIPTION OF THE INVENTION

Figure 1B:
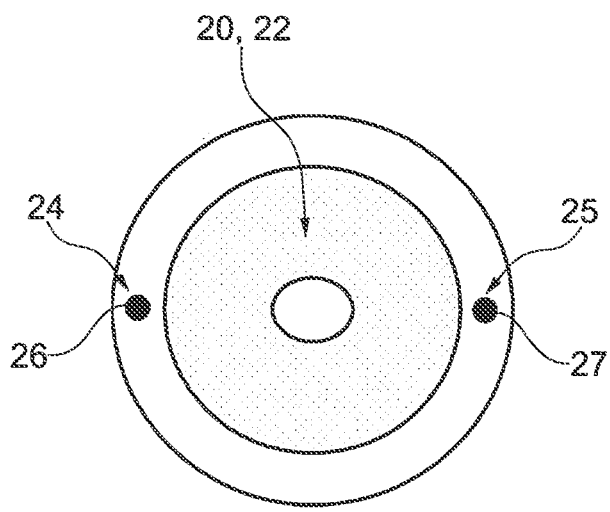
FIG. 1b shows a plan view of the diaphragm actuator according to FIG. 1a, FIG. 1c shows a cross-sectional view through the diaphragm actuator of FIG. 1a in the case of a first electrode.

FIG. 1a shows a diaphragm actuator 10 which has a first frame part 12 and a second frame part 14.

Five diaphragm layers 16 are disposed between the two frame parts 12, 14 in the illustrated embodiment. Accordingly the diaphragm actuator 10 is a multi-layer diaphragm actuator which has a plurality of diaphragm layers 16 in a frame 15 which is formed by the frame parts 12, 14.

In general, the diaphragm layers 16 are produced from a dielectric elastomer or an electro-active polymer and so they can convert an electric excitation into a mechanical movement.

The individual diaphragm layers 16 can in particular be pre-expanded as also explained later with the aid of FIGS. 12 to 20.

The diaphragm layers 16 lie directly against one another and form a stack 17 which has a first surface 17a and a second surface 17b. The second surface 17b is disposed opposite to the first surface 17a, wherein the first frame part 12 lies against the first surface 17a and the second frame part 14 lies against the second surface 17b.

The frame parts 12, 14 lie in a first edge region 18 and a second edge region 19 respectively of the diaphragm layers 16 directly against the first diaphragm layer 16a and the last diaphragm layer 16e.

Each of the diaphragm layers 16 are preferably allocated two electrodes 20, 22 each, wherein a first electrode 20 and a second electrode 22 are provided which differ in the correspondingly allocated polarity thereof as explained hereinunder. In general, the electrodes 20, 22 are allocated to the diaphragm layers 16 such that two directly adjacent diaphragm layers 16 have a different electrode sequence or a different electrode pattern.

The electrodes 20, 22 can be formed e.g. from metal. Alternatively, the electrodes 20, 22 can be formed on the basis of carbon, nano-particles or an ICP (intrinsically conducting polymer).

In order to contact the electrodes 20, 22 the frame parts 12, 14 have a first terminal 24 which is allocated to the first edge region 18, and a second terminal 25 which is allocated to the second edge region 19. The two terminals 24, 25 differ in their polarity.

Each diaphragm layer 16 accordingly has at least one electrode 20, 22 which is allocated either to the first terminal 24 or the second terminal 25.

The through-contacting of the electrodes 20, 22 of the diaphragm layers 16 and the contact with the terminals 24, 25 can be effected via contact elements 26, 27 which are formed e.g. as rivets, pressure pins and/or from an elastically-conductive elastomer. The openings provided to receive the contact elements 26, 27 can be formed e.g. by stamping.

The terminals 24, 25 can be integrated in the respective frame parts 12, 14 and also formed as plugs or bushings in order to permit simple electric contacting of the diaphragm actuator 10.

By means of the terminals 24, 25 the diaphragm actuator 10 can be supplied with a voltage and so the electro-active diaphragm layers 16 expand or contract, whereby the electrical energy is converted into mechanical movement energy.

The structure of the individual diaphragm layers 16 is explained hereinunder with the aid of FIGS. 1a to 1d:

For example, the first or lowermost diaphragm layer 16a, which lies directly on the first frame part 12, has a first electrode 20a which is provided on the upper side of the diaphragm layer 16a. The first electrode 20a is electrically coupled to the first terminal 24. An electrode 20a of this type is shown in FIG. 1c which shows a cross-sectional view.

In order to contact the first terminal 24 the first electrode 20a has a lateral protrusion which is provided in the first edge region 18.

In contrast, the second diaphragm layer 16b, which is disposed directly on the side of the first diaphragm layer 16a opposite to the first frame part 12, has a second electrode 22b on its upper side. A second electrode 22 of this type is shown e.g. in FIG. 1d.

The second electrode 22b extends to the second edge 19 and so the second electrode 22b of the second diaphragm layer 16b is electrically coupled to the second terminal 25.

This structure is repeated a number of times.

Accordingly, the third diaphragm layer 16c likewise has a first electrode 20c on its upper side, which has a protrusion which extends to the first edge region 18. In contrast, the fourth diaphragm layer 16d has a second electrode 22d on its upper side, which is coupled to the second terminal 25.

The terminating diaphragm layer 16e, in contrast, has a first electrode 20e which is electrically coupled to the first terminal 24.

In this way the stack 17 of the diaphragm layers 16 has an asymmetrical electrode pattern in cross-section since a first electrode 20 (FIG. 1c) and a second electrode 22 (FIG. 1d) are respectively provided in alternation.

Accordingly either a first or a second electrode 20, 22 is attached to the respective upper side of each second diaphragm layer 16 of the stack 17, wherein, a second or a first electrode 22, 20 is accordingly attached to the upper sides of the other diaphragm layers 16.

It is thereby ensured that the diaphragm layers 16b to 16e are each allocated a first electrode 20 and a second electrode 22 which have a different polarity. These diaphragm layers 16b to 16e are then compressed in the direction of the electric field upon application of a voltage and accordingly expand by reason of the incompressibility of the diaphragm layers 16 perpendicularly to the direction of the electric field in order to keep their volume constant. The expansion of the diaphragm layers 16b to 16e is then used to achieve the mechanical displacement movement.

In the illustrated cross-sectional view of FIG. 1a, the first diaphragm layer 16a also has a second electrode 22a on its upper side, which, however, is optional. In this way it is merely ensured that the first diaphragm layer 16a can also be used to achieve the mechanical displacement movement.

Without the second electrode 22a on its underside the first diaphragm layer 16a would function only as a support layer for the first electrode 20a on its upper side, without making a contribution to the displacement movement; it would be displaced passively when the other diaphragm layers "work".

If the second electrode 22a were omitted from the underside of the first diaphragm layer 16a then each diaphragm layer 16 would have only one electrode 20, 22 on its respective upper side.

Alternatively, all the diaphragm layers 16 can have a respective electrode 20, 22 on their upper side and their lower side, wherein the electrodes 20, 22 have correspondingly different polarity. For example, a first electrode 20 is provided on the upper side whereas a second electrode 22 is provided on the lower side. The diaphragm layer 16 disposed on the upper side must then likewise have a first electrode 20 on its lower side and so no isolation between adjacent diaphragm layers 16 is necessary.

However, in specific cases this can be provided.

Figure 1D:
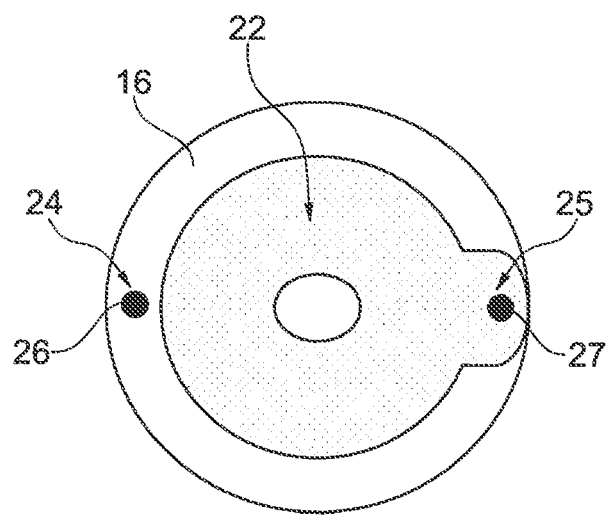
FIG. 1d shows a cross-sectional view through the diaphragm actuator of FIG. 1a in the case of a second electrode.
Figure 1C:
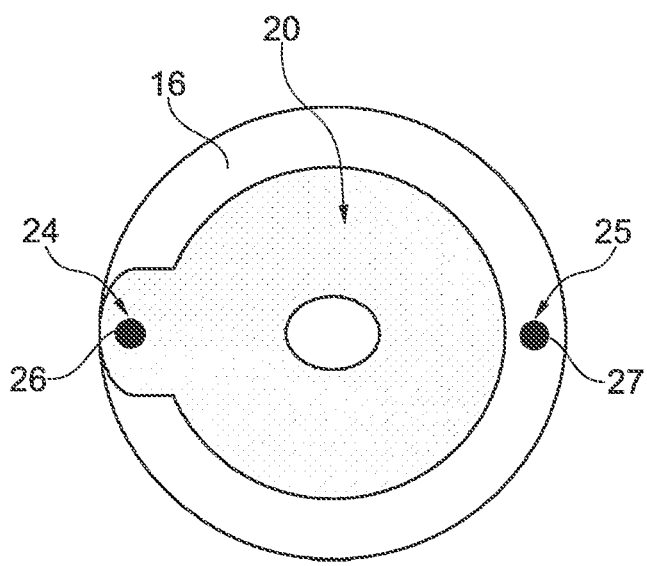
FIG. 1a shows a cross-sectional view through a first embodiment of a diaphragm actuator in accordance with the invention.

From comparing FIGS. 1b to 1d it is clear that the two electrodes 20, 22 differ only in their protrusions via which they are coupled to the respective terminal 24, 26. Otherwise, they have the same surface area which in particular corresponds almost to the whole surface of the respective diaphragm layer 16. In this way the electrodes 20, 22 lie opposite to one another over a large area.

The diaphragm actuator 10 can in particular be installed in a pretensioned manner and so e.g. the middle region of the diaphragm layers 16 is pretensioned by means of a spring in a deflected (conical) condition. The deflection of the middle region can then be controlled extremely precisely in the desired manner by application of a voltage.

Furthermore, the diaphragm actuator 10 shown in FIG. 1a then has a first connecting part 28 and a second connecting part 30. The first connecting part 28 is disposed like the first frame part 12 on the first surface 17a of the stack 17 whereas the second connecting part 30 is disposed on the second surface 17b of the stack 17.

The two connecting parts 28, 30 are each fastened centrally on the stack 17 and have in particular a height which corresponds to the two frame parts 12, 14. In this way a compact diaphragm actuator 10 is created.

FIG. 1a also shows that the respective electrodes 20, 22 of the diaphragm layers are formed in such a way that they do not cover the middle region in which the connecting parts 28, 20 are provided. The above-mentioned spring can engage on the connecting parts 28, 30. The connecting parts can also be used as an output of the actuator in order to transfer the generated stroke to another component (e.g. a valve element).

FIG. 2 shows an overview of the diaphragm actuator 10 of FIG. 1. The overview includes a plan view of the non-active diaphragm actuator 10 (FIG. 2a) and a cross-sectional view of the diaphragm actuator 10 in a non-active position (FIG. 2b) and a deflected position (FIG. 2c).

As shown by FIG. 2a the diaphragm actuator 10 is circular since both the first frame part 12 and also the second frame part 14 are circular. Furthermore, the individual diaphragm layers 16 are circular as are the connecting parts 28, 30.

In the initial condition (FIG. 2b), the diaphragm layers 16 are clamped taut between the frame parts and so the connecting parts 28, 30 are located in an initial position in the middle plane.

If a voltage is applied to the diaphragm actuator 10 via the two electrical terminals 24, 25, not shown herein, an electric field is created in each case between directly adjacent diaphragm layers 16 of the stack 17 since the directly adjacent diaphragm layers 16 are each contacted with one of the terminals 24, 25 alternately. The diaphragm layers 16 formed from electro-active polymer are compressed by reason of the power of attraction between the electrodes and so their wall thickness decreases.

However, since the material of the diaphragm layers is (almost) incompressible, the material becomes "longer". In this way the middle portion of the diaphragm layers 16 can be deflected with respect to the initial condition. In FIG. 2c the middle portion is deflected upwards in this case. This can be effected by means of a spring (not shown) which can displace the connecting parts 28, 30 upwards when the diaphragm layers are compressed between the electrodes 20, 22 and thus "lengthen".

If no spring or other component were provided which would displace the middle portion upwards as in FIG. 2c, the middle portion could also sag downwards under the effect of gravity when a voltage is applied.

Irrespective of the respective installation position and an element which pretensions the middle portion, it is clear that the applied electrical energy is converted into mechanical energy which leads to the deflection of the connecting parts 28, 30 as shown from the lower illustration in the overview.

The connecting parts 28, 30 can cooperate in particular with at least one element to be displaced and so, upon activation of the diaphragm actuator 10, a mechanical displacement of the element to be moved is achieved.

Provision can be made for the frame parts 12, 14 to have means with which the diaphragm actuator 10 can be mechanically fastened. The means can be bores or slits or fastening elements.

FIGS. 3a to 3c also show an overview of a second embodiment of the diaphragm actuator 10.

The second embodiment of the diaphragm actuator 10 differs from the first embodiment in that the frame parts 12, 14, the diaphragm layers 16 and the connecting parts 28, 30 are substantially rectangular (see FIG. 3a). Only the corners are rounded.

Otherwise the structure and mode of operation of the diaphragm actuator 10 are the same. The advantage of the second embodiment is that a plurality of actuators can be disposed closely next to one another without space going to waste between them.

Figure 3D:
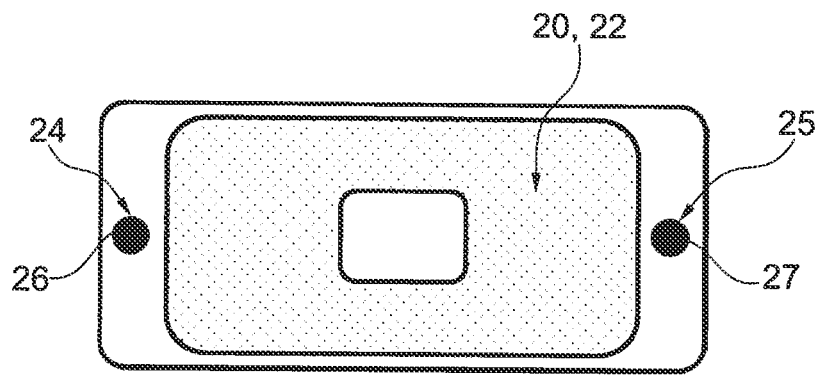
FIG. 3d shows a plan view of the diaphragm actuator according to the second embodiment.
Figure 3F:
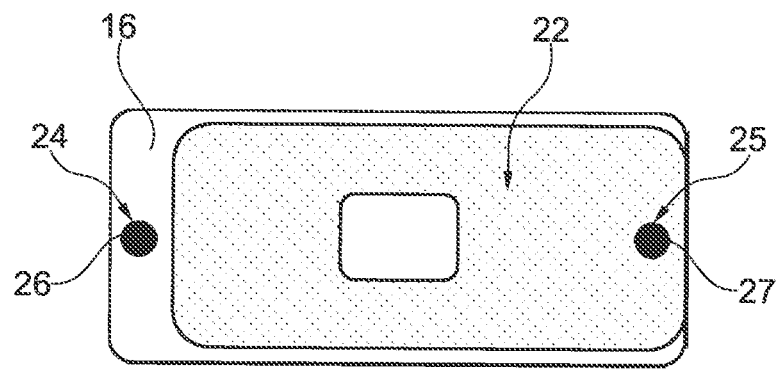
FIG. 3f shows a cross-sectional view through the diaphragm actuator of the second embodiment in the case of a second electrode.
Figure 3E:
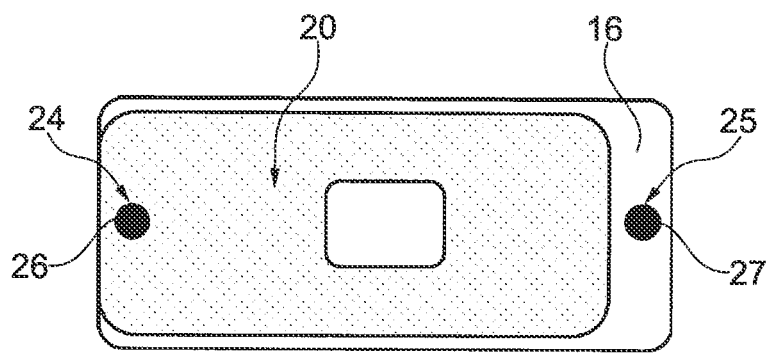
FIG. 3e shows a cross-sectional view through the diaphragm actuator of the second embodiment in the case of a first electrode.

In FIGS. 3d to 3f the diaphragm actuator 10 of FIG. 3 is shown in a plan view (FIG. 3d) and two transverse cross-sectional views (FIGS. 3e and 3f) in different planes in order to clarify the formation of the two electrodes 20, 22 in accordance with the second embodiment.

FIGS. 3d to 3f are to be understood analogously to FIGS. 1b to 1d and so the expansion of the respective electrode 20, 22 is clear in particular from FIGS. 3e and 3f.

FIG. 4 shows an overview of a third embodiment of the diaphragm actuator 10 which is similar to the first view of the first embodiment. However, the difference between the third embodiment and the first embodiment is that each of the diaphragm layers 16 has an opening 32 which is formed centrally in the respective diaphragm layer 16 (see FIGS. 4a and 4b).

The openings 32 of the respective diaphragm layers 16 are likewise circular in the illustrated embodiment.

As shown by the overview of FIG. 4, activation of the diaphragm actuator 10 in accordance with the third embodiment causes the individual diaphragm layers 16 to contract such that the diameter of the openings 32 is reduced.

In the illustrated embodiment, the openings 32 can contract so far that they close (see FIG. 4c) as compared with an initial condition (see FIGS. 4a and 4b). In this way, e.g. a flow cross-section can be directly controlled without the movement of the actuator having to be transferred to a valve element.

Figure 5A:
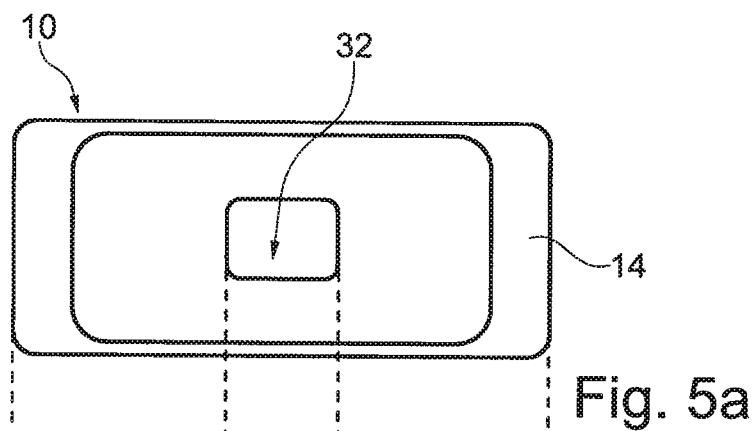
FIGS. 5a to 5c show an overview of a fourth embodiment of a diaphragm actuator in accordance with the invention.
Figure 5B:
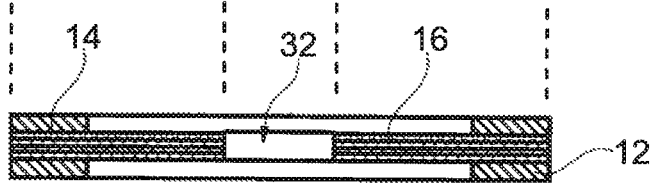
Figure 5C:
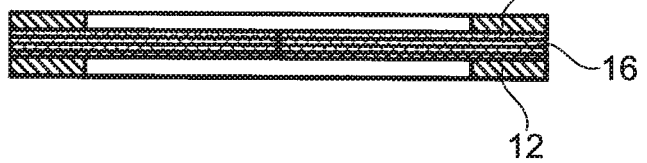
Figures 6A, 6B, 6C, 6D:
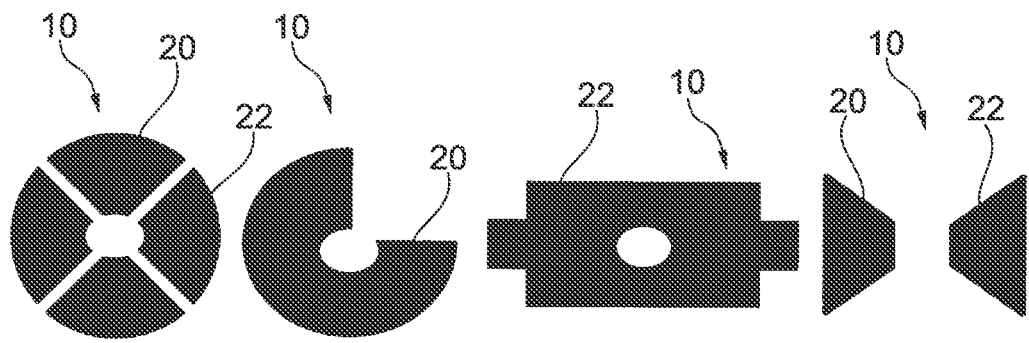
FIG. 6a shows a plan view of an electrode pattern of a fifth embodiment of a diaphragm actuator in accordance with the invention.
FIG. 6b shows a plan view of an electrode pattern of a sixth embodiment of a diaphragm actuator in accordance with the invention.
FIG. 6c shows a plan view of an electrode pattern of a seventh embodiment of a diaphragm actuator in accordance with the invention.
FIG. 6d shows a plan view of an electrode pattern of an eighth embodiment of a diaphragm actuator in accordance with the invention.

FIG. 5 illustrates a fourth embodiment of the diaphragm actuator 10 which substantially corresponds to the third embodiment, wherein the frame parts 12, 14, the diaphragm layers 16 and the openings 32 are not circular but rather substantially rectangular.

However, the remainder of the structure and the mode of operation of the diaphragm actuator 10 do not differ from the third embodiment; the openings 32 can also in this case be closed (see FIG. 5c) from an initial condition (see FIGS. 5a and 5b) in that a voltage is applied to the electrodes.

FIGS. 6a to 6e show further embodiments of the diaphragm actuator 10, wherein the arrangement of the electrodes 20, 22 or the electrode pattern are shown.

By means of the arrangement and design of the electrodes 20, 22, different movements of the diaphragm actuator 10 in accordance with the invention can be achieved. In particular asymmetric deformations of the diaphragm layers can be obtained by asymmetric electrodes.

FIG. 7 shows a plan view of a matrix diaphragm actuator 34.

The matrix diaphragm actuator 34 has a peripheral frame 35 with intermediate webs 36 disposed therebetween and forming a matrix 37.

A plurality of segments 38 are provided in this matrix 37, in which a respective diaphragm actuator 10 is disposed. The diaphragm actuators 10 are each formed in accordance with the second embodiment shown in FIG. 3.

Furthermore, the terminals 24, 25 are allocated to each individual segment 38 and so the individual diaphragm actuators 10 of the matrix diaphragm actuator 34 can be electrically actuated independently of one another.

The matrix diaphragm actuator 34 can also be formed with the diaphragm actuators 10 of the other embodiments. In particular mixtures of the embodiments can also be provided in one matrix diaphragm actuator 34.

FIG. 8 shows an overview of a ninth embodiment of the diaphragm actuator 10, wherein the plan view (FIG. 8a) and the lower cross-sectional view (FIG. 8c) now show the electrically excited position of the diaphragm actuator 10.

In contrast to the previous embodiments, the frame parts 12, 14 of the diaphragm actuator 10 are flexible. For this purpose, the diaphragm actuators 10 and in particular the frame parts 12, 12 can be formed from a DEMES structure.

As shown by the overview in FIG. 8, the individual diaphragm layers 16 and therefore the stack 17 contract upon application of a voltage.

In this way the diaphragm actuator 10 and in particular the frame 15 thereof are transferred from an equilibrium condition which is favourable in terms of energy (FIG. 8b) to an excited condition (FIG. 8c).

In this way in the illustrated embodiment, the height of the diaphragm actuator 10 is reduced as shown in particular by a comparison with FIGS. 8b and 8c.

The frame parts 12, 14 and the diaphragm layers 16 are each circular in the illustrated embodiment.

FIG. 9 shows a further embodiment of the diaphragm actuator 10 in which the frame parts 12, 14 are flexible in a manner analogous to the previous embodiment.

However, in contrast to the previous embodiment, the frame parts 12, 14 and the diaphragm layers 16 are substantially rectangular.

Furthermore, a comparison of the two embodiments shown in FIGS. 8 and 9 makes it clear that the frame parts 12, 14 can be formed differently with respect to their basic condition in terms of energy. This is manifested in that, when no voltage is applied, the frame parts contract to different extents (and accordingly deform to different extents when a voltage is applied).

The frame 15 in the embodiment of FIG. 9 contracts more strongly in the relaxed condition than the frame 15 of the embodiment of FIG. 8.

FIGS. 10a to 10e show further embodiments of the diaphragm actuator 10 which are each shown in a plan view.

In this way both the geometry of the flexible frames 15 and also that of the electrode pattern can be formed in a corresponding manner in order to achieve an extremely wide range of movements of the diaphragm actuator 10.

FIG. 11 shows an overview of a further embodiment of the diaphragm actuator 10 in which the plan view (FIG. 11a) shows the excited position of the diaphragm actuator 10 (FIG. 11c).

In this embodiment, features of the third embodiment are combined with features of the ninth embodiment: the actuator has a central opening 32, and DEMES structures are used.

In the initial condition (FIG. 11b), the central opening 32 is between quadrant-shaped diaphragm layers. These are bent in the same direction by reason of the pretensioning of their frame parts and so their tips are at a distance from one another.

If a voltage is applied to the electrodes, they deform into a stretched condition (see FIG. 11c) in which their tips (almost) lie against one another. The opening 32 is now (almost) closed.

This is possible since the frame 15 is partially flexible. The frame 15 has a flexible frame part 14a which has an annular portion and four portions surrounding the quadrant-shaped diaphragm layers which protrude inwards from the annular portion.

The partially flexible frame part 14a is fixedly disposed on the rigid frame part 14 via its annular portion, whereas the inwardly protruding portions are free and so they can deform by reason of their flexible formation as a comparison of FIGS. 11a to 11c shows.

Different mechanical movement patterns and also extremely different geometries of the diaphragm actuators 10 can generally be achieved by means of the partially flexible frame 15.

Instead of the second frame part 14 and in particular of the portion 14a, a first or a second connecting part can also be used which is correspondingly flexible.

With the aid of FIGS. 12a to 12e, the production method in accordance with the invention is described, by which the diaphragm actuator 10 in accordance with the invention can be produced.

In order to produce the diaphragm actuator 10 a polymer film 40 is provided which is clamped between a first roller pair 42 and a second roller pair 44.

Furthermore, a first tool part 46 is provided which is formed as a working table in the illustrated embodiment. The first frame part 12 is disposed on a first surface 46a of the first tool part 46, which frame part, however, is not shown in the figures for reasons of clarity.

The polymer film 40 is passed via the first roller pair 42, which rotates at a first speed, to the second roller pair 44 which rotates at a second speed. If the two roller pairs 42, 44 are rotated at the same speed, no pretensioning of the polymer film 40 is provided and so only a clamping effect is present.

However, if the second roller pair 44 is at a higher rotational speed than the first roller pair 42, the polymer film 40 is already mechanically pretensioned between the two roller pairs 42, 44.

The first tool part 46 with the first frame part 12 disposed thereon is moved in a linear and translatory manner in the direction of the polymer film 40 (see FIG. 12b) and so the polymer film 40 clamped in between the two roller pairs 42, 44 is mechanically expanded.

In this way a uniaxial expansion of the polymer film 40 takes place, i.e. a mechanical expansion in one direction.

An alignment grid can be provided which has previously been applied to the non-expanded polymer film 40. By means of the deformation of the alignment grid it is possible to see whether the desired expansion of the polymer film 40 has been achieved. The alignment grid can e.g. be electronically detected and monitored.

Furthermore, openings can be provided in the first surface 46a of the tool part 46, via which openings an overpressure or a negative pressure can be generated and so the polymer film 40 either slides well over the first surface 46a, namely when air or gas is blown between the film and the tool, or adheres thereto when the film is sucked against the surface by negative pressure.

The tool 46 can be formed from a sintered metal or at least comprise a sintered metal plate which forms the first surface 46a and so the first surface 46a is air-permeable.

The first surface 46a generally has a high surface quality since it comes into contact with the polymer film 40.

Figure 12A:
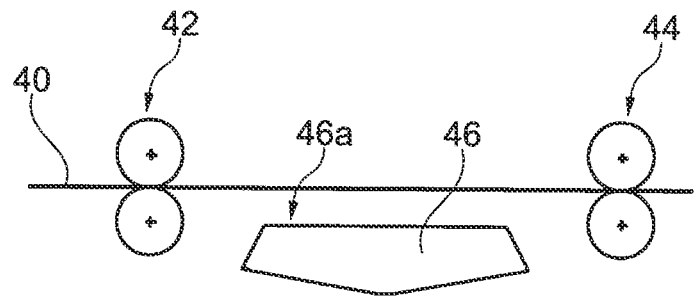
FIG. 12a shows a schematic illustration of a first method step of the production method in accordance with the invention, according to a first variation.
Figure 12B:
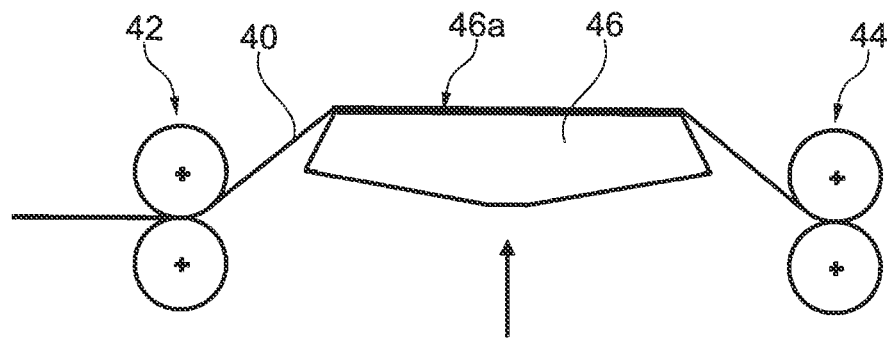
FIG. 12b shows a schematic illustration of a second method step of a first variation of the production method in accordance with the invention.
Figure 12C:
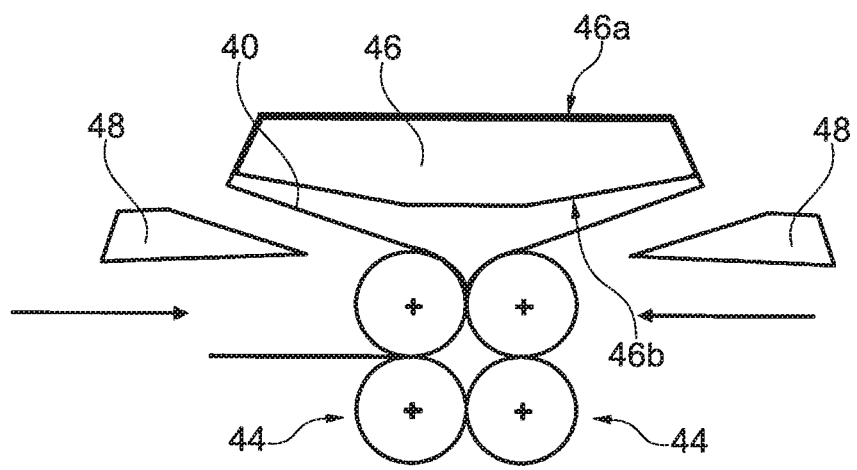
FIG. 12c shows a schematic illustration of a third method step of a first variation of the production method in accordance with the invention.

The two roller pairs 42, 44 are then moved about the first tool part 46, in particular moved in a translatory manner, until they are opposite to the second surface 46b of the first tool part 46 which is opposite to the first surface 46a (see FIG. 12c). The first tool part 46 has thereby become surrounded by the polymer film 40.

The polymer film 40 is now attached to the first tool part 46, in particular to the second surface 46b of the first tool part 46.

Figure 12D:
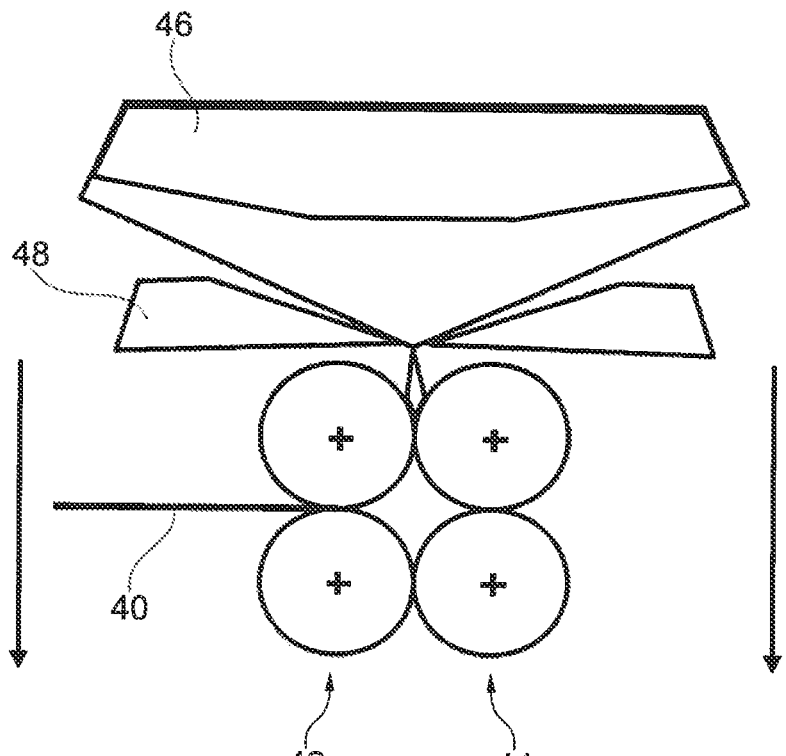
FIG. 12d shows a schematic illustration of a fourth method step of a first variation of the production method in accordance with the invention.

The polymer film 40 is then cut in the region of the two roller pairs 42, 44 by cutting means 48, in particular in a region between the fastened points on the first tool part 46 and the roller pairs 42, 44 (see FIG. 12d). The cutting means 48 can be blades or metal plates.

After cutting off the polymer film 40, the two roller pairs 42, 44 can move freely and return to their initial position.

In this way, the first diaphragm layer 16*a* is disposed on the first frame part 12. The first electrode 20 or the second electrode 22 can then be applied to the first diaphragm layer 16*a*.

The above-described steps can now be carried out again in order to apply further diaphragm layers 16 in an analogous manner, wherein the electrodes 20, 22 are each applied in an alternating manner so that a multi-layer diaphragm actuator 10 is formed.

Provision can additionally be made for the first diaphragm layer 16*a* to be fastened, in particular adhered or welded, to the first frame part 12. For this purpose, a UV-hardened silicone or a thermal ultrasonic compression welding process can be used.

Figure 12E:
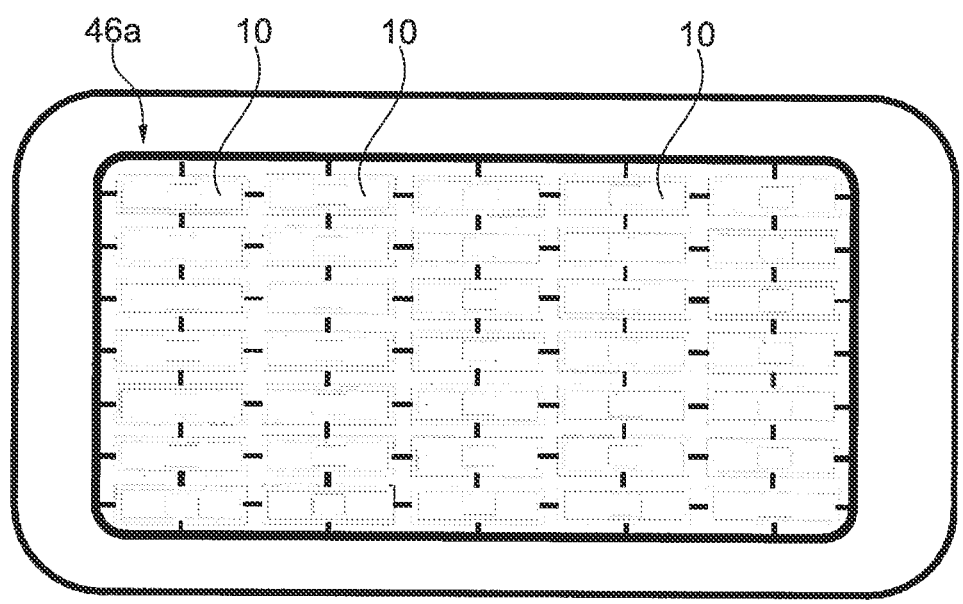
FIG. 12e shows a plan view of FIG. 12d.

FIG. 12*e* shows a plan view of the illustration shown in FIG. 12*d*. The plan view shows that a batch of diaphragm actuators 10 has been produced simultaneously. For this purpose, a plurality of first frame parts 12 or a continuous part has been disposed on the first tool part 46 which includes a plurality of first frame parts 12 in a matrix-like manner. This can be e.g. an injection moulded matrix.

After all the diaphragm layers 16 have been disposed on the respective diaphragm actuator 10, the second frame part 14 is placed onto the respective last or uppermost diaphragm layer 16. All the diaphragm layers 16 are therefore disposed between the first frame part 12 and the second frame part 14 which form the frame 15.

The individual diaphragm layers 16 are then through-contacted, wherein this can take place by means of a contact element such as a rivet or a pressure pin. The contact element used can also be formed from an elastically conductive elastomer. In this case it is advantageous additionally to dispose rigid fastening elements between the two frame parts and so the diaphragm layers are reliably held. Otherwise, the contact elements can be used to fix the diaphragm layers to the frame parts 12, 14 in the radial direction.

In general the contacting can be effected by stamping or by pressing in contact elements.

If the first diaphragm layer 16*a* is to have an electrode 20, 22 on its underside, this electrode can be attached before the first diaphragm layer 16*a* is disposed on the first frame part 12 or even subsequently, this rendering contacting more difficult.

Therefore, a diaphragm actuator 10 in accordance with the invention, which is a multi-layer diaphragm actuator, is created.

By means of such a production method, a unidirectional or uniaxial pre-expansion of the polymer film 40 can be produced which is of significance in particular in the case of a substantially rectangular diaphragm actuator 10.

Figure 13A:
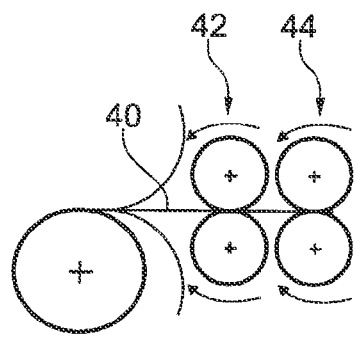
FIG. 13a shows a schematic illustration during the production method at a first moment in accordance with a first embodiment variation.
Figure 13B:
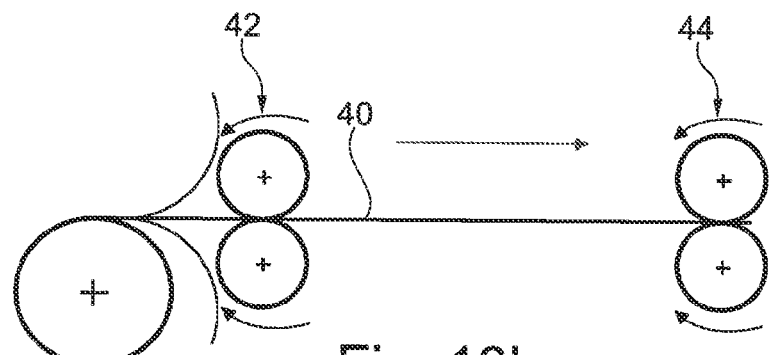
FIG. 13b shows the illustration of FIG. 13a at a second moment.

FIG. 13*a* shows the two roller pairs 42, 44 in their initial position in which the polymer film 40 is supplied to the first roller pair 42. Since the first roller pair 42 rotates, the introduced polymer film 40 is advanced to the second roller pair 44 and so the polymer film 40 is clamped between the two roller pairs 42, 44.

Then the second roller pair 44 moves away from the first roller pair 42, wherein, in dependence upon the movement of the second roller pair 44 and the rotational speed thereof, a pre-extension of the polymer film 40 may or may not take place.

The roller pairs 42, 44 can in particular be driven and controlled individually in order to ensure defined movements.

Furthermore, the roller pairs 42, 44 can have a surface hardening or coating and so they have anti-adhesion properties. Alternatively, a rubber coating can also be provided.

Figure 14A:
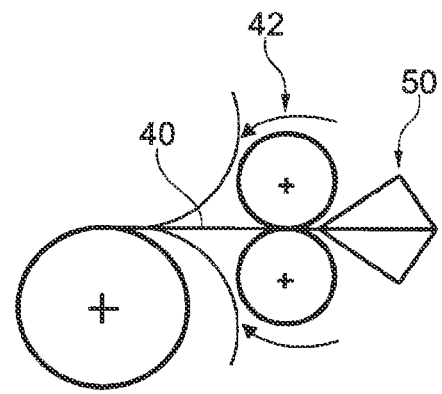
FIG. 14a shows a schematic illustration during the production method at a first moment in accordance with a second embodiment variation.
Figure 14B:
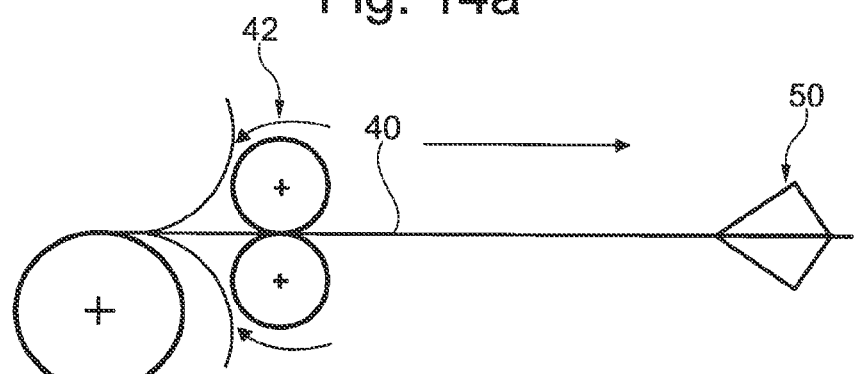
FIG. 14b shows the illustration of FIG. 14a at a second moment.

FIGS. 14*a* to 14*b* show an alternative embodiment variation of the production method in which the second roller pair has been replaced by a gripper 50 which is moved linearly at a defined speed.

A pre-expansion of the polymer film 40 can be set depending on how high the speed of the gripper 50 is.

Figure 15A:
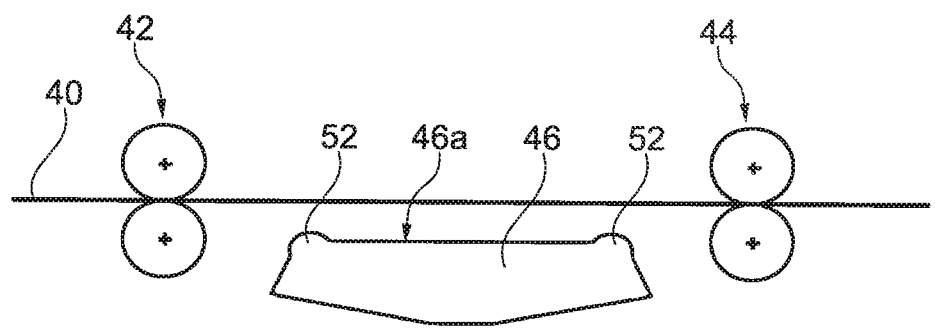
FIG. 15a shows a schematic illustration of a first method step during the production method in accordance with the invention, according to a second variation.
Figure 15B:
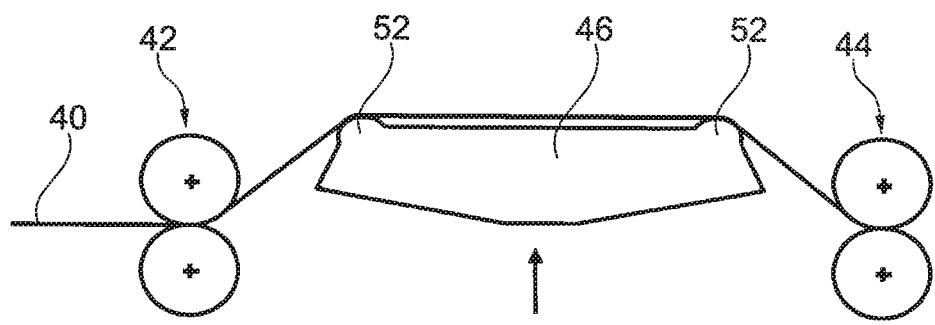
FIG. 15b shows a schematic illustration of a second method step during the production method in accordance with the invention, according to a second variation.
Figure 15C:
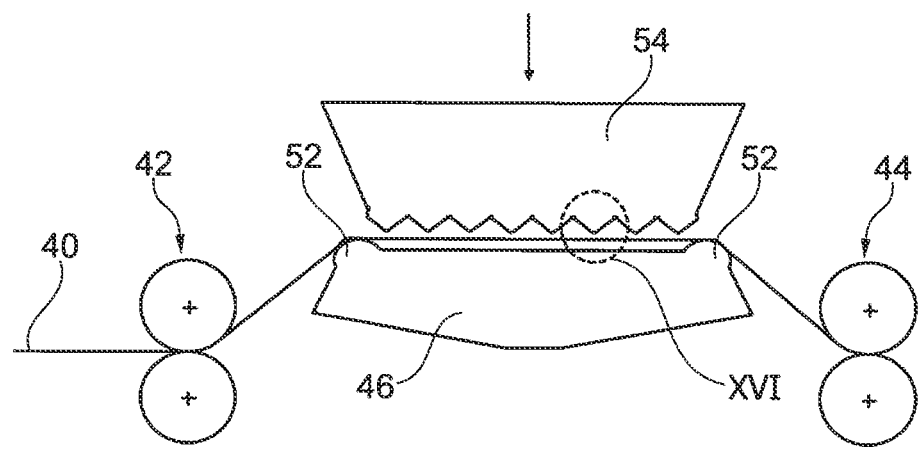
FIG. 15c shows a schematic illustration of a third method step during the production method in accordance with the invention, according to a second variation.

FIGS. 15*a* to 15*c* show an alternative embodiment variation of the production method in which a radial expansion of the polymer film 40 and therefore of the individual diaphragm layers 16 is produced.

In a manner analogous to the first production variation, the polymer film 40 is clamped, in particular pretensioned, between the first roller pair 42 and the second roller pair 44.

Furthermore, the first tool part 46 is likewise formed as a working table on which the first frame part 12 is disposed, which is not illustrated for reasons of clarity.

However, the first tool part 46 differs from that of the first embodiment variation in that protrusions 52 are provided which protrude from the first surface 46*a* of the tool part 46. The protrusions 52 are arranged on the outer edges of the tool part 46.

The function of these protrusions 52 is clarified with the aid of FIG. 15*b* since the fixedly clamped polymer film 40 comes to lie on the protrusions 52 when the first tool part 46 has been moved in a linear and translatory manner in the direction of the polymer film 40 in order to mechanically tension or expand the polymer film 40.

The protrusions 52 protrude from the first surface 46*a* of the first tool part 46 such that the polymer film 40 does not contact the first frame part 12 disposed on the first surface 46*a*.

As shown by FIG. 15*c*, the mechanically expanded polymer film 40 is now acted upon by a second tool part 54 which contacts the side of the polymer film 40 opposite to the first tool part 46. The second tool part 54 can likewise move in a linear and translatory manner in order to contact the polymer film 40.

Figure 16:
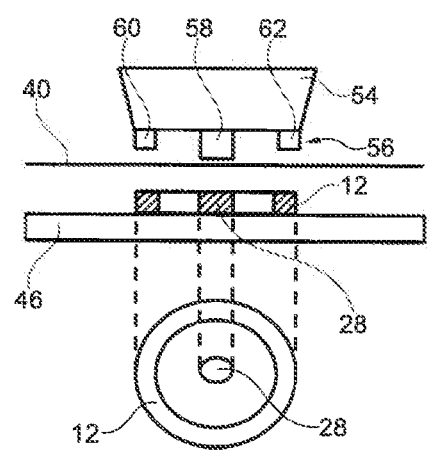
FIG. 16 shows a detailed illustration of FIG. 15c.

FIG. 16 shows in detail the region circled with a broken line in FIG. 15.

FIG. 16 shows that the second tool part 54 has at least one stamp arrangement 56 on its side facing the polymer film 40. By means of the stamp arrangement 56 the second tool part 54 has a structure which corresponds to the first frame part 12 and the first connecting part 28 which are both disposed on the first surface 46*a* of the first tool part 46.

The stamp arrangement 56 accordingly has a middle pin 58 which is allocated to the first connecting part 28, and two outer pins 60, 62 which can co-operate with the first frame part 12.

However, before the stamp arrangement 56 is activated, the polymer film 40 is fastened to the first tool part 46 in a manner analogous to the previously described embodiment. For this purpose, the two roller pairs 42, 44 are moved around the tool part 46 and so they lie opposite to the second surface 46*b*.

At that location, the polymer film 40 is fastened in an analogous manner and so now the stamp arrangement 56 can be activated.

Figure 17:
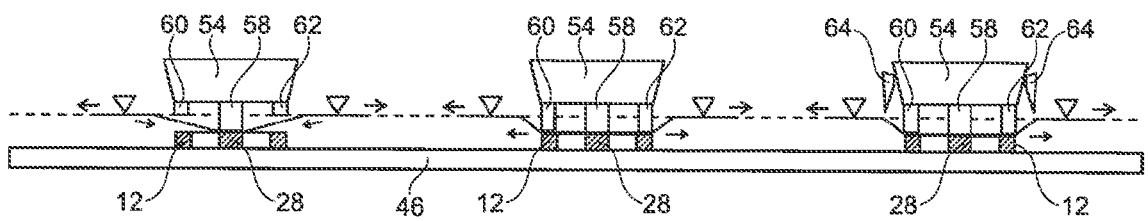
FIG. 17 shows a method overview during the production method in accordance with the invention, according to a second variation.

As shown by the progression of FIG. 17, by means of the stamp arrangement 56 the desired symmetrical and radial expansion of the polymer film 40 is achieved since the middle pin 58 of the stamp arrangement 56 is displaced first, whereby the polymer film 40 is pressed down onto the first connecting part 28.

The two outer pins 60, 62 are then likewise linearly displaced and so the polymer film 40 is pressed onto the first frame part 12.

The stamp arrangement 56 therefore constitutes a displaceable structure with which the symmetrical and radial expansion of the polymer film 40 is ensured.

Furthermore, provision can be made for the polymer film 40 additionally to be fastened to the second tool part 54 in order to achieve additional fixing. The fastening to the second tool part 54 can also take place as an alternative to the fastening to the first tool part 46.

The polymer film 40 can then be fastened to the first frame part 12, wherein this can happen by adhesion using e.g. UV-hardened silicone or by thermal ultrasonic compression welding. The second tool part 54 can comprise the corresponding instruments for fastening purposes.

In general, the second tool part 54 has a plurality of such stamp arrangements 56 and so a plurality of diaphragm actuators 10 can be produced simultaneously. This is significant in particular in the case of batch-wise production of the diaphragm actuators 10.

After the mechanical expansion of the polymer film 40 has taken place, the polymer film 40 fastened to the first tool part 46 can be cut off in a manner analogous to the first embodiment variation of the production method and so the first diaphragm layer 16a is formed.

If the polymer film 40 should now have been fastened to the second tool part 54, the polymer film 40 is correspondingly cut off at that location.

The first electrode 20 or the second electrode 22 are likewise subsequently attached to the first diaphragm layer 16a.

The above-described steps are now repeated and so a plurality of diaphragm layers 16 are attached in order to form the multi-layer diaphragm actuator 10. The electrodes 20, 22 attached to the upper sides of the diaphragm layers 16 are respectively alternated in this process and so each diaphragm layer 16 is allocated a first electrode 20 and a second electrode 22.

As a concluding step, the second frame part 14 is placed onto the last diaphragm layer 16 and the individual diaphragm layers 16 are through-contacted in order to produce an electrical connection and to mechanically couple the individual diaphragm layers 16 to the frame parts 12, 14.

Furthermore, the second tool part 54 can have cutting means 64 with which the polymer film 40 fastened to the first tool part 46 can be cut off directly in the region of the first frame part 12 or of the diaphragm actuator 10. This can take place after fastening the respective diaphragm layer 16 or after all diaphragm layers 16 have been disposed.

The first tool part 46 formed as a working table can be formed analogously to the embodiment previously depicted in FIGS. 12a to 12e.

The radial expansion of the polymer film 40 is suitable in particular for the diaphragm actuators 10 which are circular.

Figure 18:
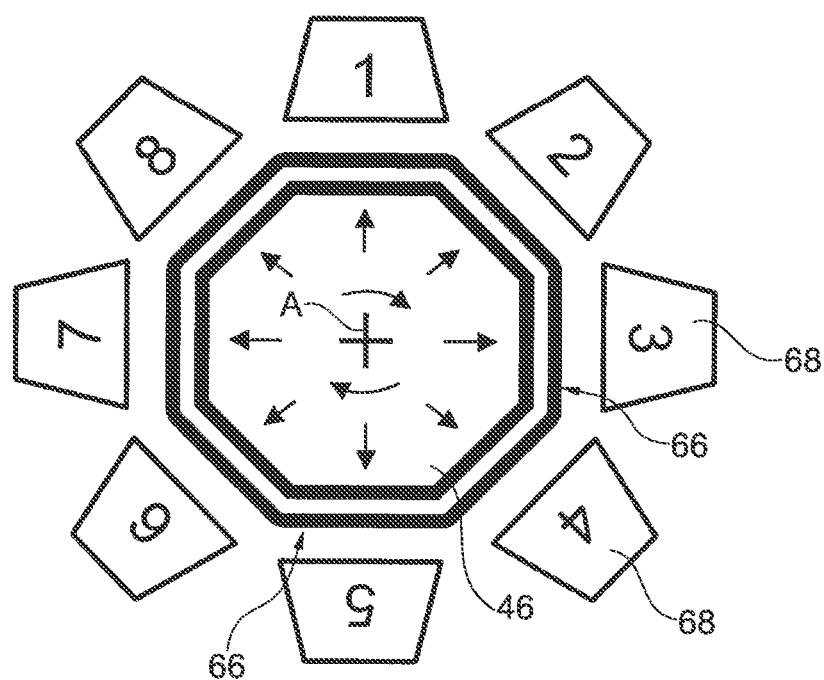
FIG. 18 is a schematic overview of the production method in accordance with the invention, according to a third variation.

FIG. 18 schematically shows a third embodiment variation of the production method in accordance with the invention for producing the diaphragm actuator 10 in accordance with the invention.

Figure 19:
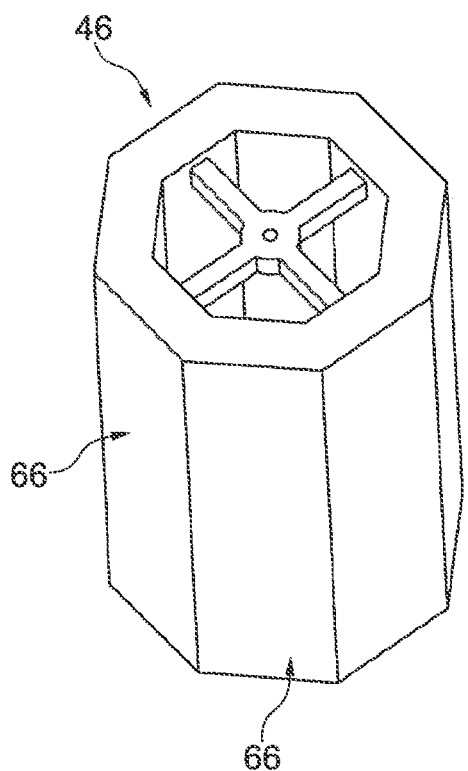
FIG. 19 is a perspective illustration of the first tool part formed as a tool drum, which is used in the method shown in FIG. 18.

In this alternative embodiment of the production method, a working drum is used as the first tool part 46 and is shown in a perspective view in FIG. 19.

In the illustrated embodiment, the first tool part 46 formed as a working drum has eight working surfaces 66 which are each allocated to one of eight working stations 68 as shown in FIG. 18.

As already indicated by the arrows in FIG. 18, the first tool part 46 formed as a working drum can be moved rotationally and in a linearly translatory manner, whereby one of the eight working surfaces 66 lies opposite to one of the working stations 68 in a step-by-step manner. For this purpose, the tool part 46 rotates by 45° each time about its axis of rotation A.

The working stations 68 generally likewise have at least one degree of freedom and so they can be linearly displaced.

The production of the diaphragm actuator 10 is described with the aid of FIGS. 20a to 20h and with reference to the third embodiment variation of the production method in accordance with the invention.

In the first process step, the polymer film 40 is inserted between the two roller pairs 42, 44 into a unit 70 formed by the working stations 68 and the first tool part 46. The polymer film 40 is in this process clamped between the two roller pairs 42, 44, in particular it is slightly pretensioned.

The first tool part 46 is located in a position which is displaced in a translatory manner from the centre.

The first working station 68a is moved in the first process step in a translatory and linear manner towards the polymer film 40 and so it almost comes into contact with the polymer film 40. The first working station 68a can measure the thickness of the polymer film 40, wherein the thickness of the polymer film 40 can be adjusted according to the movement of the roller pair 42, 44. In particular, a greater pretensioning of the polymer film 40 can be produced with the different speeds of the roller pairs 42, 44 and the stretching resulting therefrom.

The thickness can be measured in particular by means of optical techniques such as white light interferometry, transmission spectroscopy or laser profilometry.

Figure 20A:
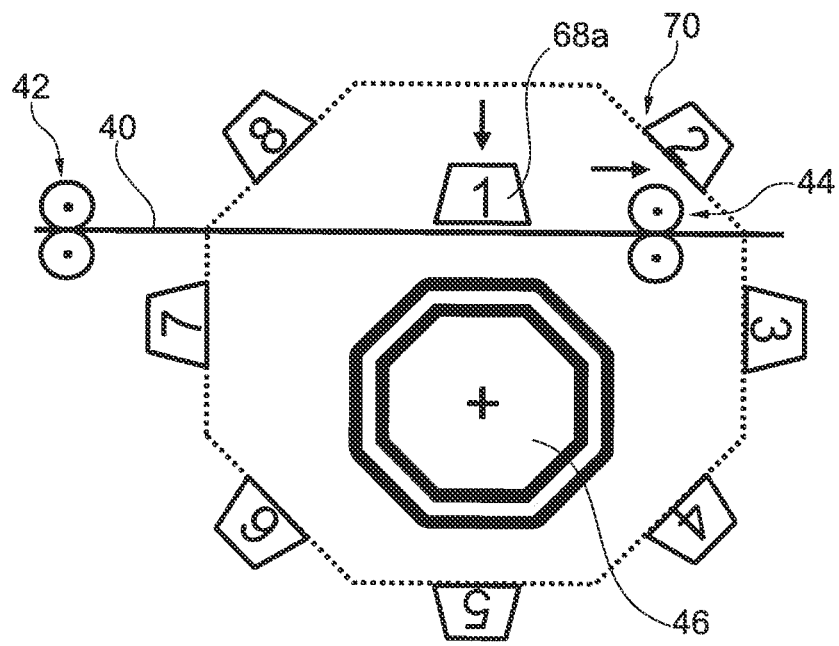
FIG. 20a shows a first method step of the production method in accordance with the invention, according to the third variation.
Figure 20B:
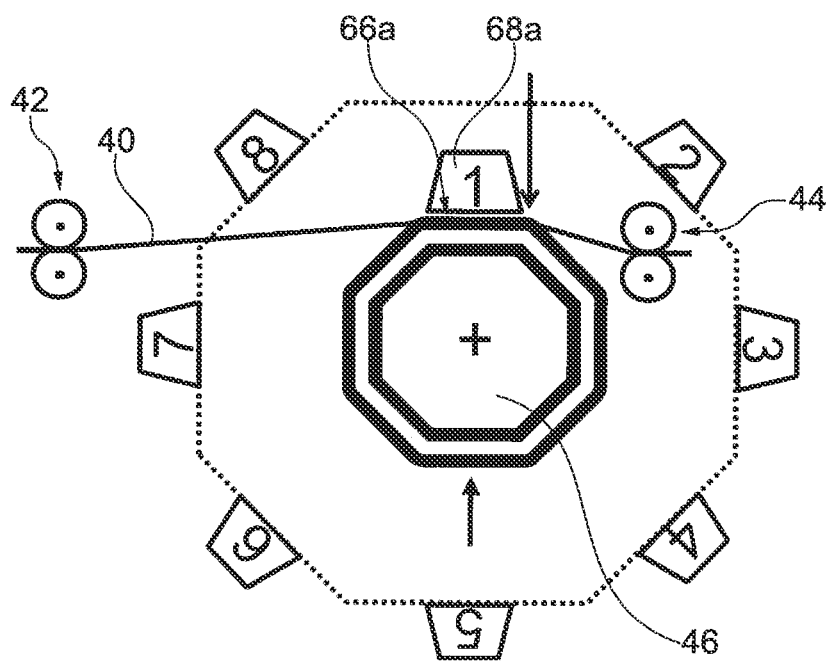
FIG. 20b shows a second method step of the production method in accordance with the invention, according to the third variation.

If the desired thickness of the polymer film 40 is achieved, the second process step is carried out (see FIG. 20b).

In this process step, the first tool part 46 formed as a working drum is moved in a translatory manner, wherein it is moved with a first working surface 66a against the polymer film 40 and expands said film mechanically. The first frame part 12 is placed on the first working surface 66a and so this frame part is disposed between the first working surface 66a and the polymer film 40.

The polymer film 40 can slide along the first working surface 66a of the first tool part 46 provided that the surface of the first working surface 66a is formed appropriately.

In this position the first working station 68a measures the thickness of the polymer film 40 again and fastens the polymer film 40 to the first tool part 46. The polymer film 40 is then cut off in a region between the second roller pair 44 and the fastening point, as schematically illustrated by the arrow.

In order to fasten the polymer film 40 to the first tool part 46, the first working station 68a can be formed substantially analogously to the second tool part 54 in accordance with the second embodiment variation of the production method.

Figure 20C:
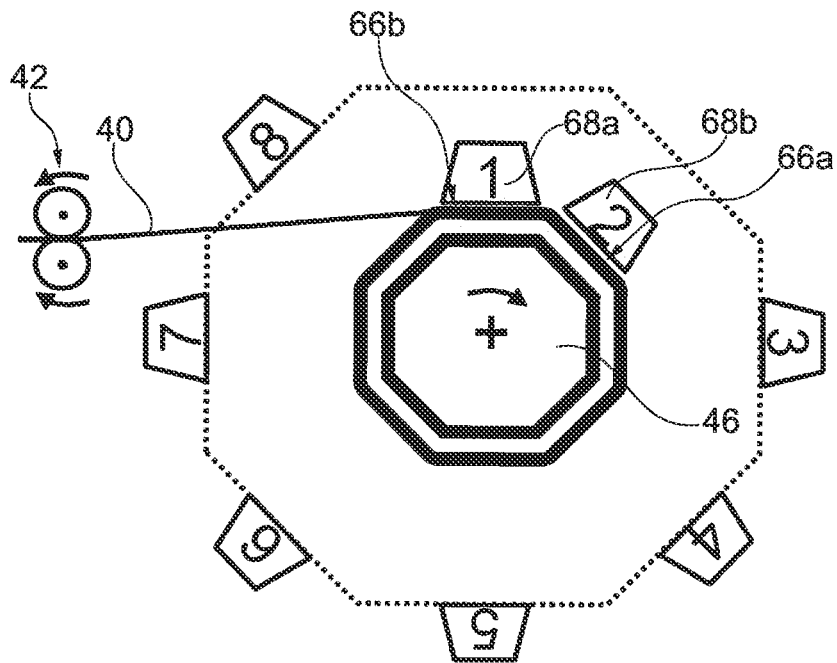
FIG. 20c shows a third method step of the production method in accordance with the invention, according to the third variation.

The first tool part 46 formed as a working drum is now rotated about its axis of rotation A by 45° and so the first working surface 66a lies opposite to the second working station 68b (FIG. 20c). This constitutes the beginning of the third process step.

In the second working station 68b a surface treatment of the polymer film 40 is carried out. This can be e.g. a plasma activation which increases the adhesion of the electron layer.

At the same time, in the first working station 68a, a second batch of diaphragm actuators 10 is prepared since the same steps as in FIG. 20b are carried out.

In general, the expansion of the polymer film 40 should remain constant, for which reason the thickness of the polymer film 40 is constantly monitored in the first working station 68a.

Figure 20D:
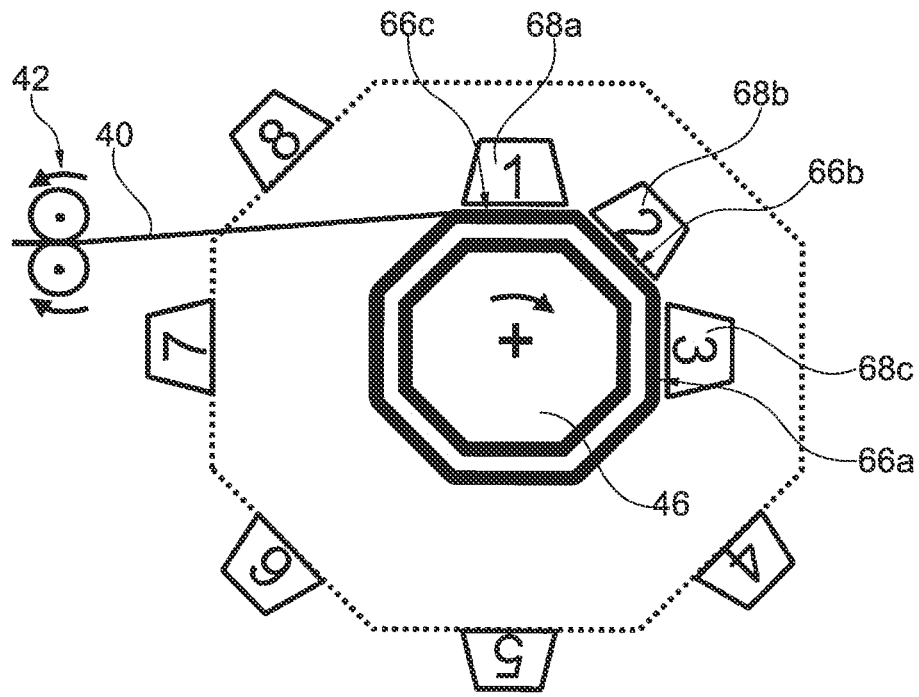
FIG. 20d shows a fourth method step of the production method in accordance with the invention, according to the third variation.
Figure 20E:
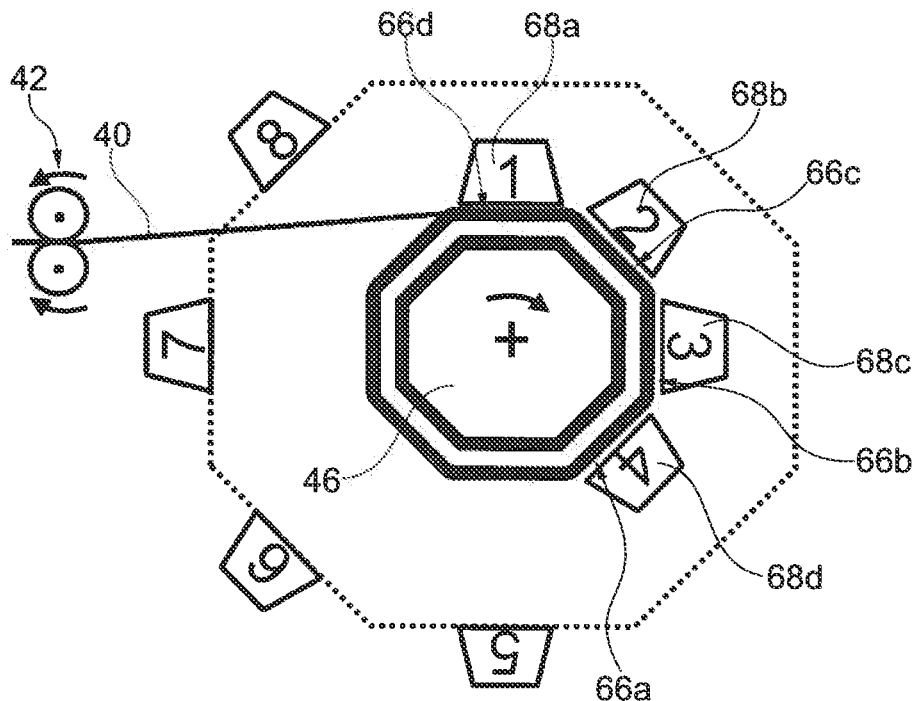
FIG. 20e shows a fifth method step of the production method in accordance with the invention, according to the third variation.

After the surface treatment has been carried out, the first tool part 46 formed as a working drum rotates again by 45° and so the first working surface 66a lies opposite to the third working station 68c (see FIG. 20d).

In the third working station 68c, the first electrode 20 or the second electrode 22 is attached to the treated surfaces of the polymer film 40 and so the corresponding electrode 20, 22 is later attached to the upper side of the diaphragm layer 16.

At the same time a third batch of diaphragm actuators 10, which is disposed on the third working surface 66c, is prepared in the first working station 68a, wherein the second batch undergoes a surface treatment in the second working station 68b.

In a fourth process step, the first tool part 46 formed as a working drum is again rotated by 45° (see FIG. 20e) and so the first working surface 66a of the first tool part 46 lies opposite to the fourth working station 68d.

In the fourth working station 68d, a surface treatment is again carried out, wherein this can be a corona treatment which should avoid bubbles occurring during lamination.

The further batches of the diaphragm actuators 10 are correspondingly treated in the working stations 68a to 68c.

The first tool part 46 now rotates further in 45° steps, wherein the fifth to eighth working surfaces 66e to 66h are provided with a batch and the process steps provided in the first four working stations 68a to 68d have been carried out.

When the first working surface 66a reaches the first working station 68a, a second diaphragm layer 16 is then attached.

Figure 20F:
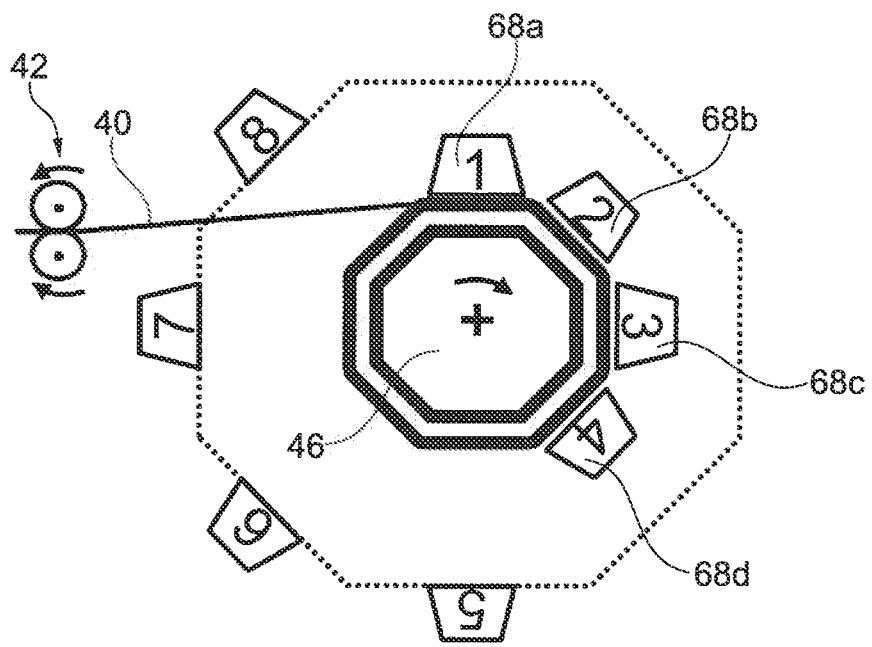
FIG. 20f shows a sixth method step of the production method in accordance with the invention, according to the third variation.

The steps are now repeated multiple times and so each batch of diaphragm actuators 10 is provided with a plurality of diaphragm layers 16 (see FIG. 20f). The individual diaphragm layers 16 are laminated together to form a composite.

The working stations 5 to 8 only come into use when the diaphragm actuators 10 comprise all the diaphragm layers 16.

Figure 20G:
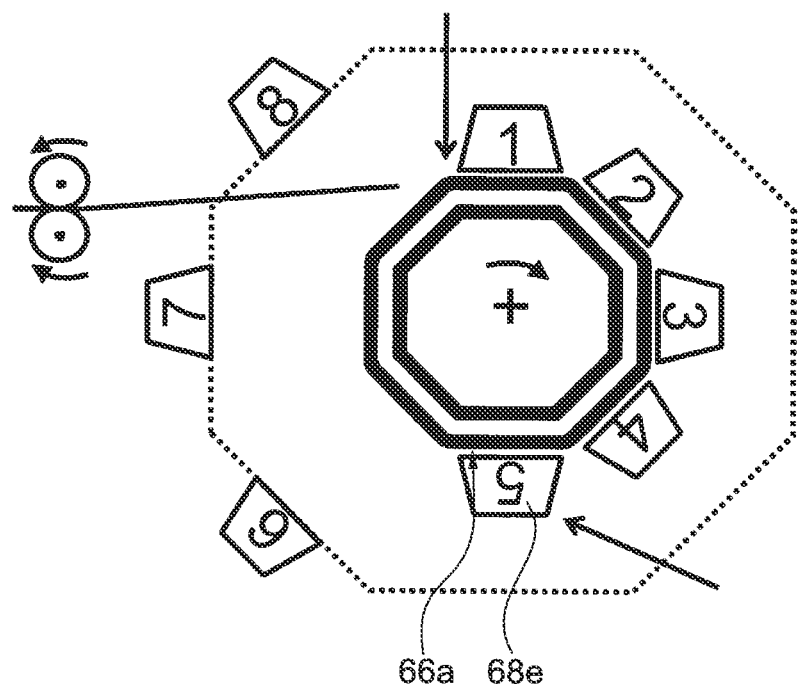
FIG. 20g shows a seventh method step of the production method in accordance with the invention, according to the third variation.
Figure 20H:
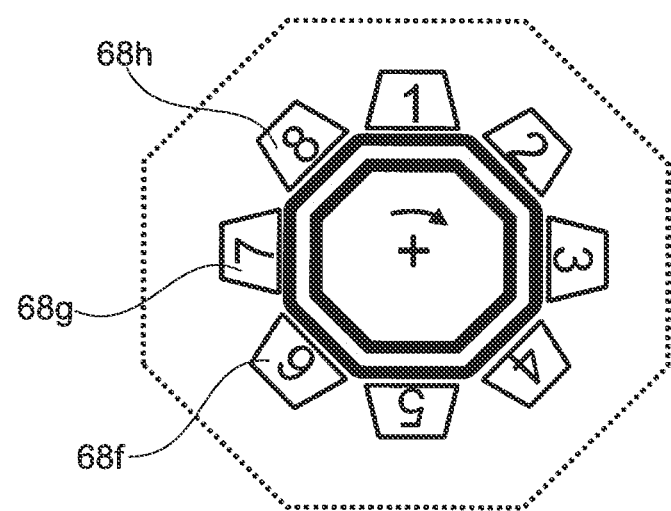
FIG. 20h shows an eighth method step of the production method in accordance with the invention, according to the third variation.

When this is the case, the second frame part 14 is disposed onto the uppermost diaphragm layer 16 in the fifth working station 68e, and is fastened thereto (see FIG. 20g).

At the same time, the polymer film 40 is severed in the region of the first working station 68a. The further batches of diaphragm actuators 10 continue to be processed in the preceding working stations 68a to 68d.

The first tool part 46 then rotates again by 45°, wherein the individual diaphragm layers 16 of the diaphragm actuators 10 are through-contacted in the sixth working station 68f.

After renewed rotation of the first tool part 46 by 45°, the batch of finished diaphragm actuators 10 is tested in the seventh working station 68g.

After a further rotation by 45°, the diaphragm actuator 10 reaches the eighth working station 68h in which the batch of diaphragm actuators 10 is stamped or cut out in order to form the individual diaphragm actuators 10.

Figure 21A:
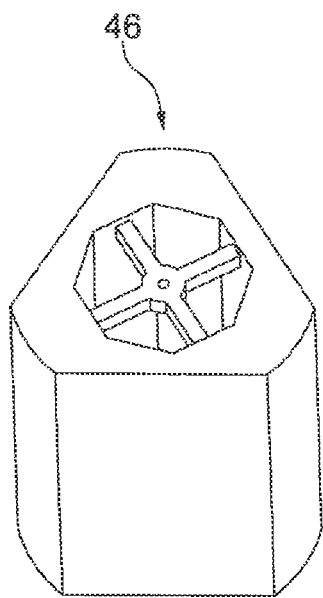
FIG. 21a shows a first alternative embodiment of the first tool part.
Figure 21B:
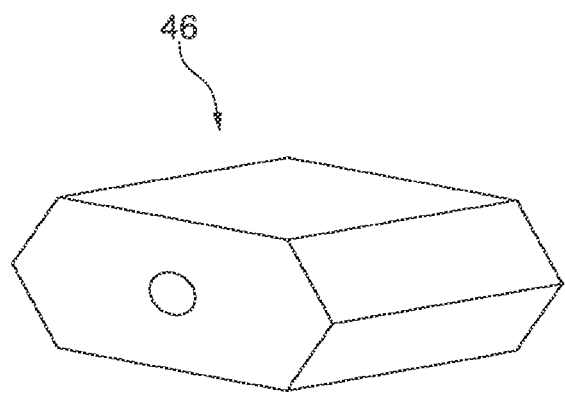
FIG. 21b shows a second alternative embodiment of the first tool part.
Figure 21C:
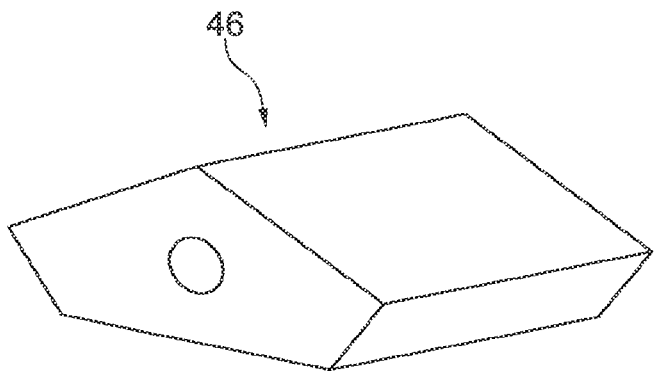
FIG. 21c shows a third alternative embodiment of the first tool part.
Figure 22E:
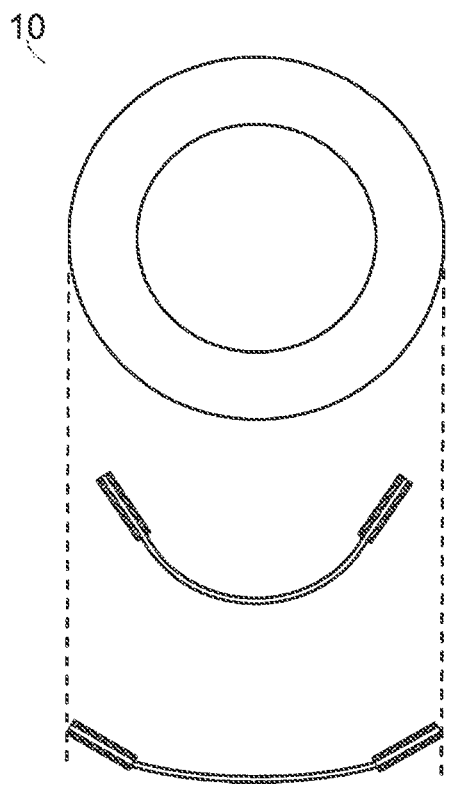
FIG. 22e shows an overview of a further diaphragm actuator produced by the production method in accordance with the invention.
Figure 22F:
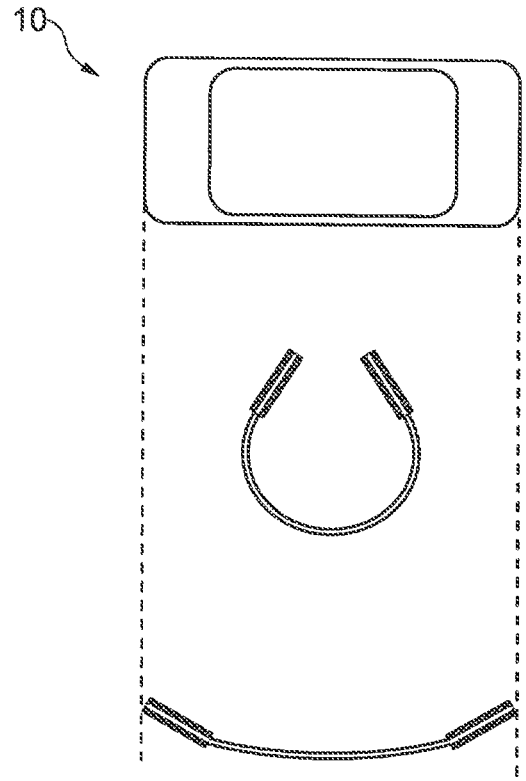
FIG. 22f shows an overview of a further diaphragm actuator produced by the production method in accordance with the invention.
Figure 22G:
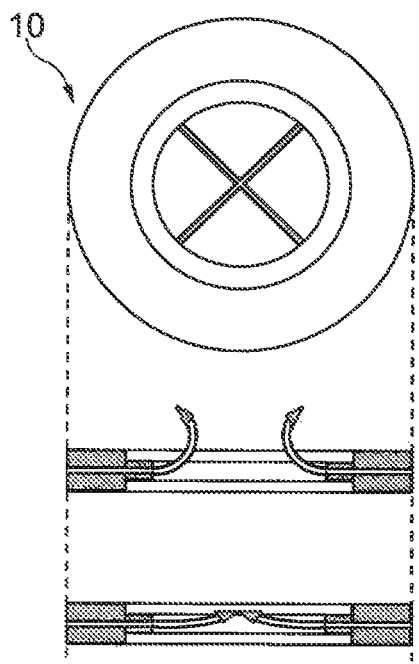
FIG. 22g shows an overview of a further diaphragm actuator produced by the production method in accordance with the invention.

In FIGS. 21a to 21c alternative embodiments of the first tool part 46 are illustrated which can be used in the production method in accordance with the third embodiment variation.

The illustrated tool parts 46 have fewer working surfaces 66 and so a working surface 66 can be allocated a plurality of working stations 68.

Furthermore, FIGS. 22a to 22g show different embodiments of the diaphragm actuator 10 which can likewise be produced with the production method in accordance with the invention according to one of the three alternative embodiments.

These correspond substantially to the previously described embodiment with the difference that the diaphragm actuators 10 are formed as single-layer diaphragm actuators.

In general, with the production method in accordance with the invention a diaphragm actuator 10 in accordance with the invention is created which can provide greater forces but is of a small structure.

The invention claimed is:

1. A diaphragm actuator which has a first frame part and a second frame part, and having at least two diaphragm layers which are disposed in a stacked manner and formed as electro-active polymer layers and are arranged between said first frame part and said second frame part, said diaphragm layers being arranged so as to be immediately adjacent to form a stack, said first frame part contacting a first surface of said stack of diaphragm layers and said second frame part contacting a second surface of said stack of diaphragm layers which is opposite to said first surface, said diaphragm layers being clamped in between a single frame, said first frame part constituting a lower termination of said diaphragm actuator, whereas said second frame part forming an upper termination of said diaphragm actuator.

2. The diaphragm actuator as claimed in claim 1 wherein a first connecting part is provided which mechanically contacts said first surface of said diaphragm layers and/or wherein a second connecting part is provided which mechanically contacts said second surface of said diaphragm layers.

3. The diaphragm actuator as claimed in claim 2 wherein said first connecting part and/or said second connecting part is/are arranged centrally on said surface.

4. The diaphragm actuator as claimed in claim 1 wherein said diaphragm layers each have an opening which is provided centrally in said diaphragm layer.

5. The diaphragm actuator as claimed in claim 4 wherein said opening is circular.

6. The diaphragm actuator as claimed in claim 1 wherein said diaphragm layers have one of a circular or substantially rectangular shape.

7. The diaphragm actuator as claimed in claim 1 wherein at least one of said first and second frame parts has one of a circular or substantially rectangular shape.

8. The diaphragm actuator as claimed in claim 1 wherein at least one of said first and second frame parts is at least partially flexible.

9. The diaphragm actuator as claimed in claim 1 wherein said diaphragm layers each comprise at least one electrode.

10. The diaphragm actuator as claimed in claim 9 wherein said electrodes of directly adjacent diaphragm layers are disposed offset with respect to one another.

11. The diaphragm actuator as claimed in claim 1 wherein said first frame part has a first terminal and/or said second frame part has a second terminal.

12. The diaphragm actuator as claimed in claim 11 in combination with claim 9 wherein said electrodes of said diaphragm layers are electrically contacted, wherein said electrodes of every second of said diaphragm layers are coupled to said first terminal and the other of said diaphragm layers are coupled to said second terminal.

13. The diaphragm actuator as claimed in claim 1 wherein the diaphragm actuator has more than two diaphragm layers.

14. A diaphragm actuator which has a first frame part and a second frame part, and having at least two diaphragm layers which are disposed in a stacked manner and formed as electro-active polymer layers and are arranged between said first frame part and said second frame part, said diaphragm layers being arranged so as to be immediately adjacent, said first frame part contacting a first surface of diaphragm layers and said second frame part contacting a second surface of said diaphragm layers which is opposite to said first surface, said diaphragm layers lying directly against one another and forming a stack which has a first surface and a second surface, the second surface being disposed opposite to said first surface, said first frame part lying against said first surface and said second frame part lying against said second surface.

15. The diaphragm actuator as claimed in claim 14 wherein the diaphragm actuator has more than two diaphragm layers.

16. A diaphragm actuator which has a first frame part and a second frame part, and having at least two diaphragm layers which are disposed in a stacked manner and formed as electro-active polymer layers and are arranged between said first frame part and said second frame part, said diaphragm layers being arranged so as to be immediately adjacent, said first frame part contacting a first surface of said diaphragm layers and said second frame part contacting a second surface of said two diaphragm layers which is opposite to said first surface, said diaphragm layers each comprising at least one electrode, said first frame part having a first terminal and said second frame part having a second terminal, said electrodes of said diaphragm layers being electrically contacted, said electrodes of every second of said diaphragm layers being coupled to said first terminal and the other of said diaphragm layers being coupled to said second terminal, said individual diaphragm layers being through-contacted in order to produce an electrical connection with said terminals.

* * * * *

UNITED STATES PATENT AND TRADEMARK OFFICE
CERTIFICATE OF CORRECTION

PATENT NO. : 10,158,064 B2
APPLICATION NO. : 14/927235
DATED : December 18, 2018
INVENTOR(S) : Cricia de Carvalho Rodegheri et al.

It is certified that error appears in the above-identified patent and that said Letters Patent is hereby corrected as shown below:

On the Title Page

Item [73], immediately following Buerkert Werke GmbH, Ingelfingen, (DE), Insert -- CUT Membrane Technology GmbH, Ingelfingen, (DE) --

Signed and Sealed this
Second Day of June, 2020

Andrei Iancu
*Director of the United States Patent and Trademark Office*